(12) United States Patent
Irby et al.

(10) Patent No.: US 12,100,464 B2
(45) Date of Patent: Sep. 24, 2024

(54) REPAIRABLE LATCH ARRAY

(71) Applicant: ADVANCED MICRO DEVICES, INC., Santa Clara, CA (US)

(72) Inventors: Joel Thornton Irby, Austin, TX (US); Grady L. Giles, Dripping Springs, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 18/302,510

(22) Filed: Apr. 18, 2023

(65) Prior Publication Data

US 2023/0253063 A1     Aug. 10, 2023

Related U.S. Application Data

(63) Continuation of application No. 17/561,115, filed on Dec. 23, 2021, now Pat. No. 11,657,892.

(51) Int. Cl.
*G11C 7/10* (2006.01)
*G11C 29/12* (2006.01)
*G11C 29/44* (2006.01)
*G11C 29/46* (2006.01)

(52) U.S. Cl.
CPC ........ *G11C 29/4401* (2013.01); *G11C 7/1012* (2013.01); *G11C 7/1036* (2013.01); *G11C 7/106* (2013.01); *G11C 7/1087* (2013.01); *G11C 29/1201* (2013.01); *G11C 29/46* (2013.01); *G11C 2029/1202* (2013.01)

(58) Field of Classification Search
CPC . G11C 29/4401; G11C 7/1012; G11C 7/1036; G11C 7/106; G11C 7/1087; G11C 29/1201; G11C 29/46; G11C 2029/1202; G11C 29/022; G11C 29/32; G11C 29/76
See application file for complete search history.

(56) References Cited

U.S. PATENT DOCUMENTS

| | | |
|---|---|---|
| 5,369,752 A | 11/1994 | Giles et al. |
| 8,446,161 B2 | 5/2013 | Chang |
| 2003/0131294 A1 | 7/2003 | Motika et al. |
| 2008/0222469 A1 | 9/2008 | Rickert et al. |
| 2009/0210763 A1 | 8/2009 | Eckelman et al. |
| 2012/0057411 A1 | 3/2012 | Koeppe et al. |
| 2014/0211551 A1 | 7/2014 | Kim et al. |
| 2020/0327951 A1* | 10/2020 | Jung ............ G11C 17/18 |
| 2022/0277800 A1 | 9/2022 | Zeli et al. |

OTHER PUBLICATIONS

International Search Report and Written Opinion, PCT/US2022/053554, Mar. 30, 2023, 11 pages.

* cited by examiner

*Primary Examiner* — Xiaochun L Chen

(57) ABSTRACT

An integrated circuit includes a latch array including a plurality of latches logically configured in rows and columns, a plurality of repair latches operatively coupled to the plurality of latches and latch array built in self-test and repair logic (LABISTRL) coupled to the plurality of latches. In some implementations the LABISTRL configures latches in the array as one or more column serial test shift register, detects one or more defective latches of the plurality of latches based on applied test data, and selects at least one repair latch in response to detection of at least one defective latch.

20 Claims, 22 Drawing Sheets

REPAIRABLE LATCH ARRAY

CROSS-REFERENCE TO RELATED APPLICATIONS

This is a continuation application of and claims priority for patent entitled to a filing date and claiming the benefit of earlier-filed U.S. patent application Ser. No. 17/561,115, filed Dec. 23, 2021. Each patent application cited herewith is hereby incorporated by reference in its entirety.

BACKGROUND OF THE DISCLOSURE

A latch array is a small, embedded memory in integrated circuit chips that has rows and columns of latches that are used by processing cores and other units to store data, instructions, state data for the processing core, look-up-tables or for other purposes. There can be tens of thousands of latch arrays on a chip. To test each latch array at manufacture, on some chips, array scan (RASCAN) circuitry configures latches in the latch array during test mode to be a serial shift register. However, detected defects in the latches are not repairable and the chip is discarded when defects are detected. The result is lower chip yield as latch arrays grow in size. Also, there is a limit on the size of latch arrays because they are not repairable.

Latch arrays have also been configured to be memory built in self-test (MBIST) testable or Automatic Test Program Generation (ATPG) testable. However, for MBIST testable solutions, the test data (at the width of the array) which is generated on-chip needs to be routed from the controller to the array for each column of the logic array. This causes utilizing scarce routing tracks and increasing static power usage during normal operation by the MBIST logic. For Automatic Test Program Generation (ATPG) configurations, test patterns and test control is done off-chip using external test systems. The latch arrays are tested but they are not repairable.

BRIEF DESCRIPTION OF THE DRAWINGS

The implementations will be more readily understood in view of the following description when accompanied by the below figures, wherein like reference numerals represent like elements, and wherein.

Figure 1:
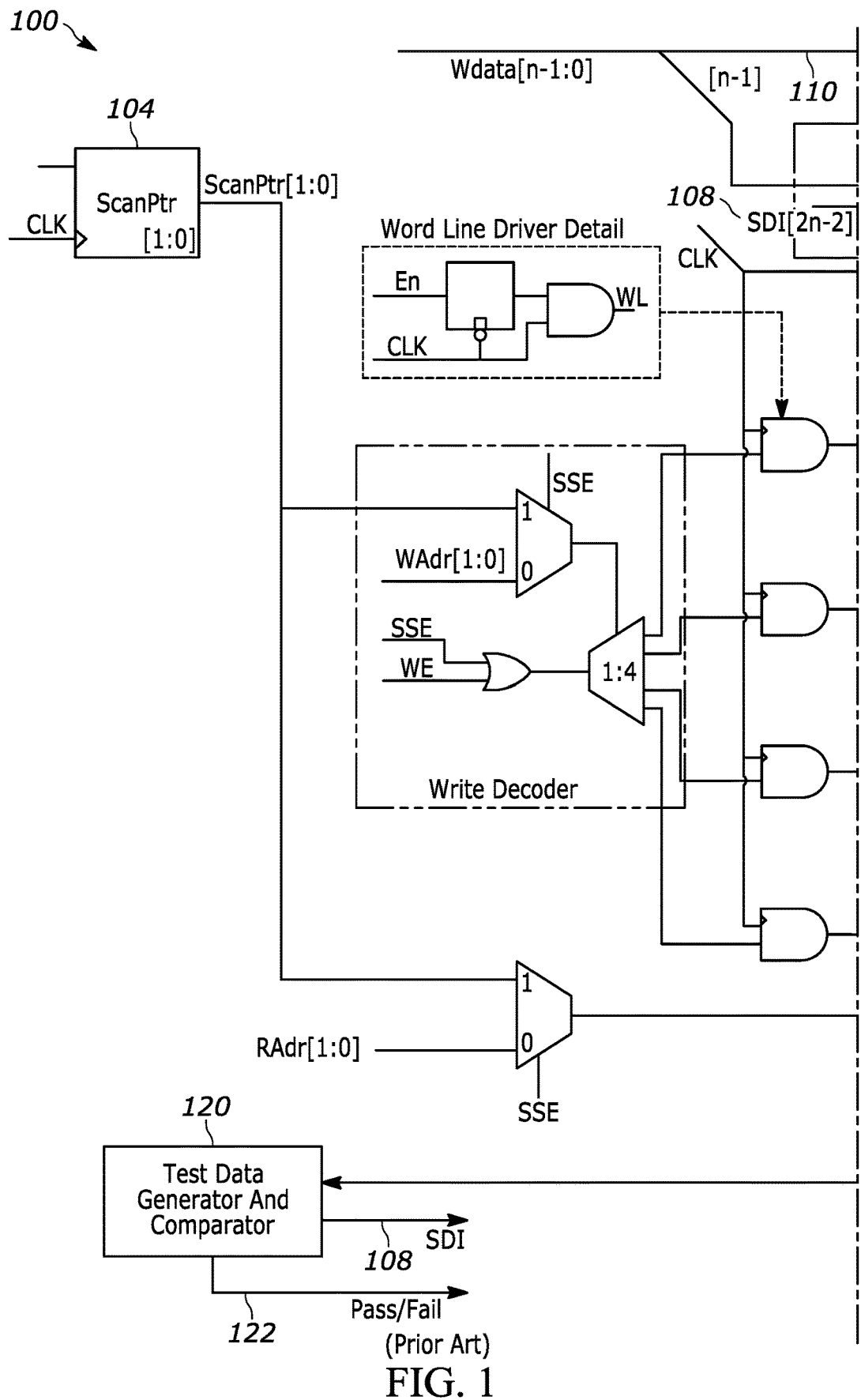
FIG. 1 illustrates an example of a prior art array scan configuration for a latch array.
Figure 1:
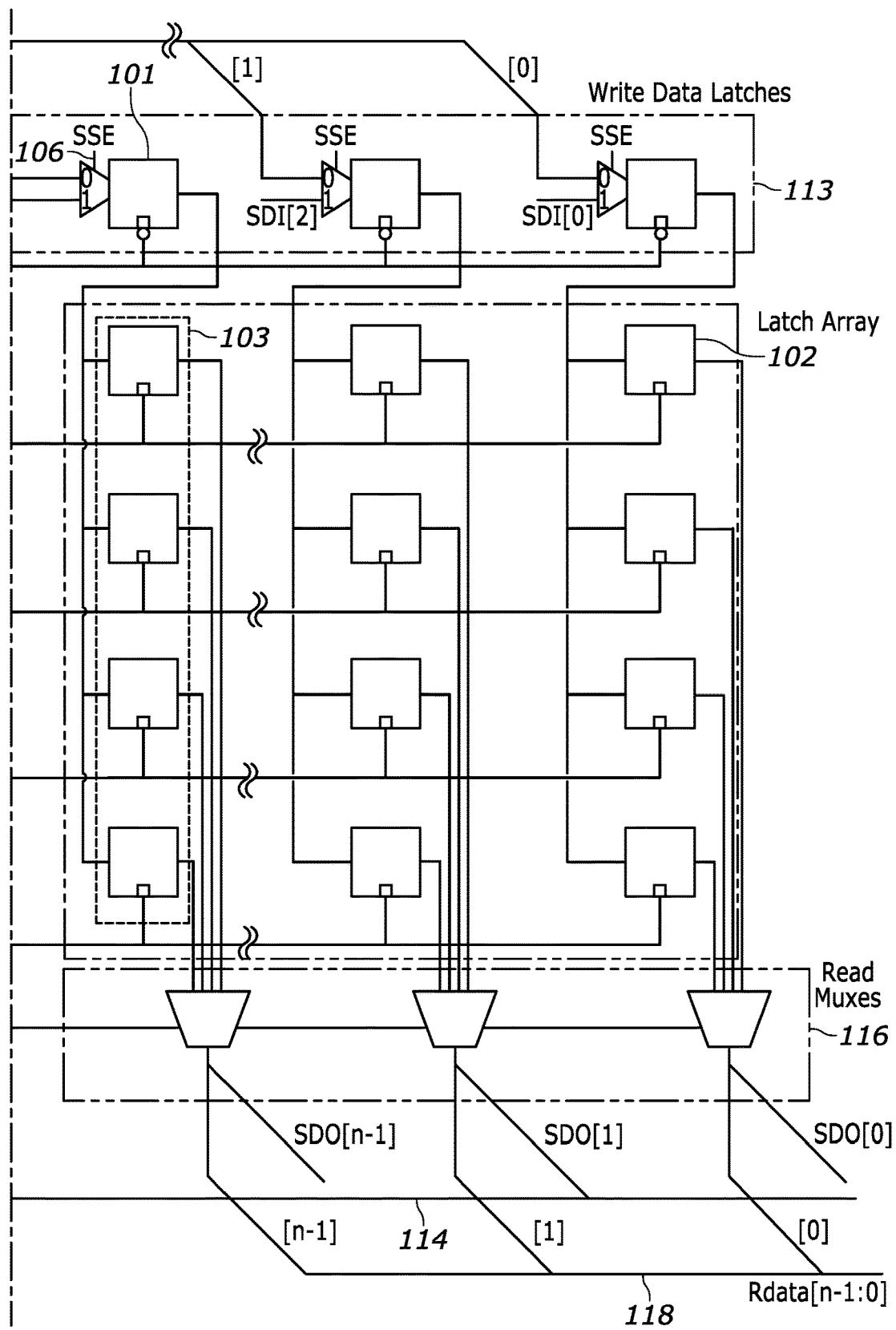

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF IMPLEMENTATIONS

A latch array with an array scan configuration has repairable latches. The latch array includes spare rows and/or columns, tests the latch arrays and automatically replaces defective latches with spare latches. In some implementations the testing and repair is done as part of the manufacturing process to improve yield and in other implementations, the testing and repair is done in the field after the product is in use.

In some implementations, the latch array with array scan configuration identifies defective latches in a latch array, including faulty circuitry that make the latches defective, repairs the defective latches using redundant latches and retests the latch array using redundant latches, avoiding the defective latches. Logic stores the repair configuration for use during normal functional mode. In some implementations, a new master status register (MSR) register is used as a control register for the repair and retest operation.

In some implementations, an integrated circuit includes a latch array including a plurality of latches logically configured in rows and columns, a plurality of repair latches operatively coupled to the plurality of latches, and latch array built in self-test and repair logic (LABISTRL) coupled to the plurality of latches. In some implementations the LABISTRL configures at least some of the latches that are in columns as a serial shift register. In some implementations, each of a plurality of columns of the latch array are configured as a serial test shift register. The LABISTRL detects one or more defective latches of the plurality of latches based on applied test data, and selects at least one repair latch to replace the defective latch in response to detection of the defective latch. In some implementations, one or more entire rows are replaced and in certain implementations one or more columns are replaced in response to detection of at least one detected defective latch.

In some examples, the latch array self-test logic includes a test scan pointer that sequentially selects each row in the latch array during a test mode to load on-chip test data into the serial test shift registers.

In certain examples, the latch repair logic repairs one or more detected defective latches by selecting a row of repair latches and deselecting a row of latches that includes the defective latch.

In some examples, the latch repair logic repairs one or more defective latches by selecting a column of repair latches and deselecting a column of latches that includes the detected defective latch.

In certain examples, the integrated circuit includes control logic to automatically retest the latch array using the selected repair latches. In some examples, control logic performs in-field latch array testing and repair of one or more defective latch arrays contingent upon repair latches being available for repair.

In certain examples, the latch array self-test logic loads on-chip test data into the configured serial test shift registers, that are configured as column shift registers, on a row by row basis using the test scan pointer.

In some implementations, an integrated circuit includes processing circuitry, a latch array, operatively coupled to the processing circuitry including a plurality of latches logically configured in rows and columns, a plurality of repair latches operatively coupled to the plurality of latches, latch array built in self-test and repair logic coupled to the plurality of latches that configures each of a plurality of columns of the latch array as a serial test shift register, detects one or more defective latches of the plurality of latches based on applied test data, and selects at least one of the plurality of repair latches to replace one or more defective latches in response to detection of at least one detected defective latch.

In certain examples, the latch array built in self-test logic includes a test scan pointer to sequentially select each row in the latch array during a test mode to load on-chip test data into the serial test shift registers. In some implementations, the processing circuitry issues read and/or writes to the latch array during normal operation.

In some examples, the latch array built in self-test and repair logic includes latch array repair logic, coupled to the plurality of repair latches, and selects repair latches of the plurality of repair latches and to deselect latches in the latch array that are determined to be defective, a controller, coupled to the latch repair logic to control the latch array repair logic, to configure each of the latch columns of latch arrays as serial shift registers and to control retesting of latches of the latch array after selection of the plurality of repair latches.

In certain examples, the latch array repair logic includes one or more latch repair control registers and the latch array repair logic deselects a row of latches that include a defective latch and shift in a row of repair latches.

In some implementations, latch array repair logic includes at least one bypass mux configured to bypass a defective row that includes at least one defective latch, that can include defective circuitry which prevents proper access of the row for reading or writing. In certain implementations, the latch array repair logic incudes at least one bypass mux configured to bypass a defective column that includes at least one defective latch.

In certain examples, the control logic includes a test data generator and test data compare logic that provides latch fail indication data.

In some examples, the latch array repair logic repairs one or more detected defective latches by selecting a column of repair latches and deselecting a column of latches that includes the detected defective latch.

In certain examples, the control logic performs in-field latch array testing and repair of one or more defective latch arrays when repair latches are available for repair.

In some implementations, a method of operating a latch array having plurality of latches logically configured in rows and columns includes configuring a plurality of latches that are in a column as at least one serial test shift register; detecting at least one defective latch of the plurality of latches based on applied test data; and selecting at least one repair latch in response to detection of at least one defective latch; and deselecting the at least one defective latch.

In certain examples, a test scan pointer sequentially selects each row in the latch array during a test mode to load on-chip test data into the serial test shift registers.

In some examples, repairing one or more detected defective latches by selecting a row of repair latches and deselecting a row of latches that includes the detected defective latch.

In certain examples, repairing one or more detected defective latches by selecting a column of repair latches and deselecting a column of latches that includes the detected defective latch. In some examples, performing in-field latch array testing and repair of one or more defective latch arrays is provided when repair latches are available for repair.

FIG. 1 illustrates an example of a prior art array scan configuration. A latch array 100 includes logical rows and columns of latches 102 (e.g., not flip flops). In this example there are four rows of latches and three columns so that there are three bits per row. In this example, a B phase latch 101 has an output that is received by multiple A phase latches in column 103. However, it will be recognized that any suitable latch array configuration may be employed. When performing an on-chip test of the latch arrays, a scan pointer 104 is used along with a scan shift enable signal 106 to allow scan data in (SDI) 108 to be scanned into the latch array. The columns are configured as serial shift registers during the test scan operation. During normal operation, write data 110 is allowed to be written into the latch array when the input mux 112 is switched to allow write data to pass to the latch array. This is shown with respect to write data latches 113.

During the test mode operation, also referred to as the test scan operation, the array scan configuration provides test serial shift register paths. An example test serial shift register includes receiving latch 101, and including each latch in the column 103. Each latch is clocked, in sequence, according to whether the Write Decoder activates its Word Line (WL). Likewise, the Read Decoder—(e.g., the set of 2-input MUXes selecting between ScanPtr[1:0] and Radr[1:0]) will select one of the latches in the column to drive that column's SDO.

The array scan operation forms column shift registers and appears to form a serial shift register out of each column. The scan pointer 104 (ScanPtr) chooses which latch to expose on the SDO (Scan Data Out) port, but it is as if data values are being shifted serially from SDI (Scan Data In) to SDO.

The scan pointer 104 is swapped in place of both the write-address and the read-address, such that while each row of the latch array is being written, it is also being read. The scan pointer 104, which is a simple counter circuit, cycles thru the address-space in such a way that each column appears to be a serial shift register, with the first bit at the top and the last bit at the bottom, as drawn in the figure.

Scan data in 108 is written into the latch array and scan data out (SDO) shown as 114 is read out of the read muxes 116 under control of the scan pointer 104. The scan pointer 104 also sequentially selects each row to allow scan data in to be provided in parallel to all latches in a row. Data values are loaded in from SDI and "unloaded" on SDO simultaneously during each cycle. During normal operation, read data is read out as shown by bus 118.

An on-chip test data generator and comparator 120 generates the scan data in 108 and receives the scan data out 114 and compares the scan data in 108 to the scan data out 114 and produces pass or fail indication data 122 depending upon whether the scan data in for a row matches the scan data out of a row. For example, if the scan data out for a given row does not match the test input data, a failure is indicated. If a failure is indicated, the chip is discarded. However, discarding the chip is expensive and reduces production yields. The problem occurs more often as latch array sizes are increased. Latch arrays have been limited in size due their impact on chip yield.

Figure 2:
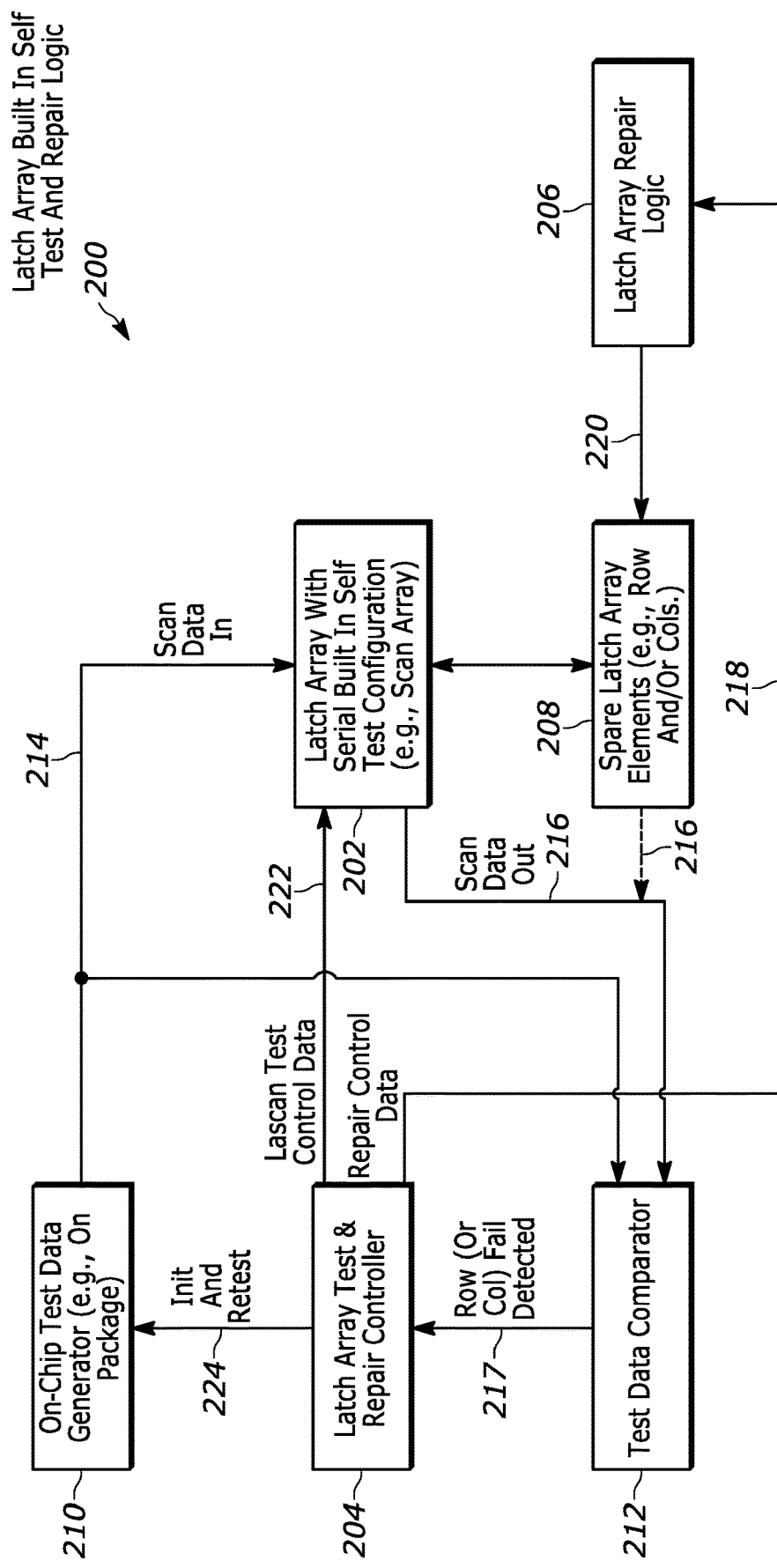
FIG. 2 is a block diagram illustrating a latch array with built-in self-test and repair logic in accordance with one example set forth in the disclosure.

FIG. 2 is a block diagram illustrating one example of a repairable latch array in accordance with one embodiment. In this example, an integrated circuit includes processing circuitry that issues read and/or write requests to a latch array during normal operation. Examples of processing circuitry include but are not limited to one or more processing cores of a central processing unit and/or a graphics processing unit, a digital controller, or any suitable digital processing unit that stores and/or retrieves data in the latch array. In this example, the integrated circuit includes the repairable latch array that includes built in self-test logic to scan through a latch array for a self-test operation but further includes repair latches, scan logic to test the repair latches and logic that repairs the latch array when defects are detected in some latches in the array. In this example, latch array built-in self-test repair logic 200 includes an on-die latch array test and repair controller 204, latch array repair logic 206, spare latch array elements 208 (also referred to as redundant latches), on-chip test data generator 210 and an on on-die test data comparator 212. In some implementations, the spare latch array elements are configured in rows and/or columns and/or any suitable configuration of a spare latch(s) so that an entire row is replaced, and/or an entire column is replaced and/or other suitable number of defective latches are replaced.

By way of general operational description, as part of a manufacturing test operation or an in-field test operation, the on-chip test data generator 210 generates test data, also referred to as scan data in 214 into latches in the latch array. During test mode, the test data that is applied is scanned out and shown as scan data out 216 which is received by the test data comparator 212. The test data comparator 212 compares the scan data in 214 to the read scan data out 216 to determine if a latch in the latch array has failed. If a failure indication is generated, such as an indication that a latch in a row or column has failed, failure indication data 217 is generated. In response to a defect being detected, the latch array test and repair controller 204 issues repair control data 218 to the latch array repair logic 206. The latch array repair logic 206 issues control data 220 to the spare latch array elements 208 to select latch repair elements to replace the defective elements and deselect the row or column of latch elements that have been determined to be defective. Examples of repair control data 218 include in the case of a single spare row, the repair control data is single logical-1 value in one of the RRpr bits, labeled Latch Repair Ctrl Register (also denoted as 502 in FIG. 5). In the case of no faulty rows, then all of the bits in the latch repair control registers 502 will be logical-0; in the event of a single bad row, one of them will be logical-1 and the others, logical-0.

The latch array test and repair controller 204 issues latch array scan test control data 222 to initiate a self-test process by issuing, for example, scan shift enable (SSE) data and other initiation data as required. For example, as shown by data 224, the latch array test and repair controller 204 initializes the data in the latch arrays to be all zeros prior to a test start and initiates the on-chip test data generator and other logic. In some implementations, the latch array test and repair controller 204 also automatically initiates a re-test of the latch array after it has been reconfigured to include repair latches that replace the defective latches. If the retest is successful, the latch array is identified as being usable.

In some implementations, if one bad latch is detected, a row is determined to be a bad row. The logic shuts off the row by deselecting the row and selects a row above as a new row for example. The bad row is deselected. In effect, the write clock for a row is turned off. It will be recognized that a similar approach is done for column repair wherein if a latch is determined to be defective within a column, in some implementations an entire column is shut off. In certain implementations, for row repair, the latch repair logic repairs one or more detected defective latches by selecting a row of repair latches and deselecting, such as by bypassing a row of latches that includes the defective latch. In some implementations, the latch repair logic repairs one or more detected defective latches by selecting a column of repair latches and deselecting, such as by bypassing a column of latches that includes the detected defective latch. In some implementations, bypass muxes are used to bypass defective rows or columns. However, it will be recognized that fewer than all latches in a row or column may also be shut off. For example, where groups of latches are configured to be addressed through partial columns or rows, a subset of latches can be selectable.

By way of example, in some implementation, if a row of a latch array has a faulty Word Line Driver circuit, then that entire row will fail the test. A row can be defective (i.e., faulty) because of a bad Word Line Driver or other circuits. Another example is that all of the latches in a row (or column) can be fault-free, but the wires which connect them to the write/read circuits could be defective. In that case, the disclosed self-test and repair circuits will identify the row/column as defective and select a spare row/column instead. As used herein a defective latch includes faulty circuits that prevent proper access to read or write the latches other than the actual latches of the latch array, and the disclosed structure and operation detects when these additional faulty circuits exist too.

In some implementations there is an added control register for setting the latch array built in self-test operation so that when set, the controller runs the self-test and repair operation. As such, the controller can be activated during power on, or in response to some other condition, such as at a predetermined time interval, in the field to run the self-test and repair operation or can be set during the manufacturing process to be run. As such the control logic in certain implementations performs in-field latch array testing and repair of one or more defective latch arrays when repair latches are available for repair. In some examples, during the initialization state, the state of the latches is unknown so the control logic causes a write of zeros in all of the latches and then begins the test sequence. In some implementations, writing of an opposite value and reading of the past value is performed for each latch. In some implementations, the test pattern writes the same values into each latch of the latch array and the comparators compare the output from the read muxes to the input test pattern and when they do not match, flags a defect that has occurred in a row of the latch array. The redundant or repair latches are switched in after all latch array rows are tested, in one example.

When used as part of a manufacturing test, the latch array self-test and repair operation tests for manufacturing defects whereas when the latch array self-test and repair operation is used in field, it detects and repairs for defects caused by normal wear and tear of processing units and other circuits on a die, for example.

Figure 3:
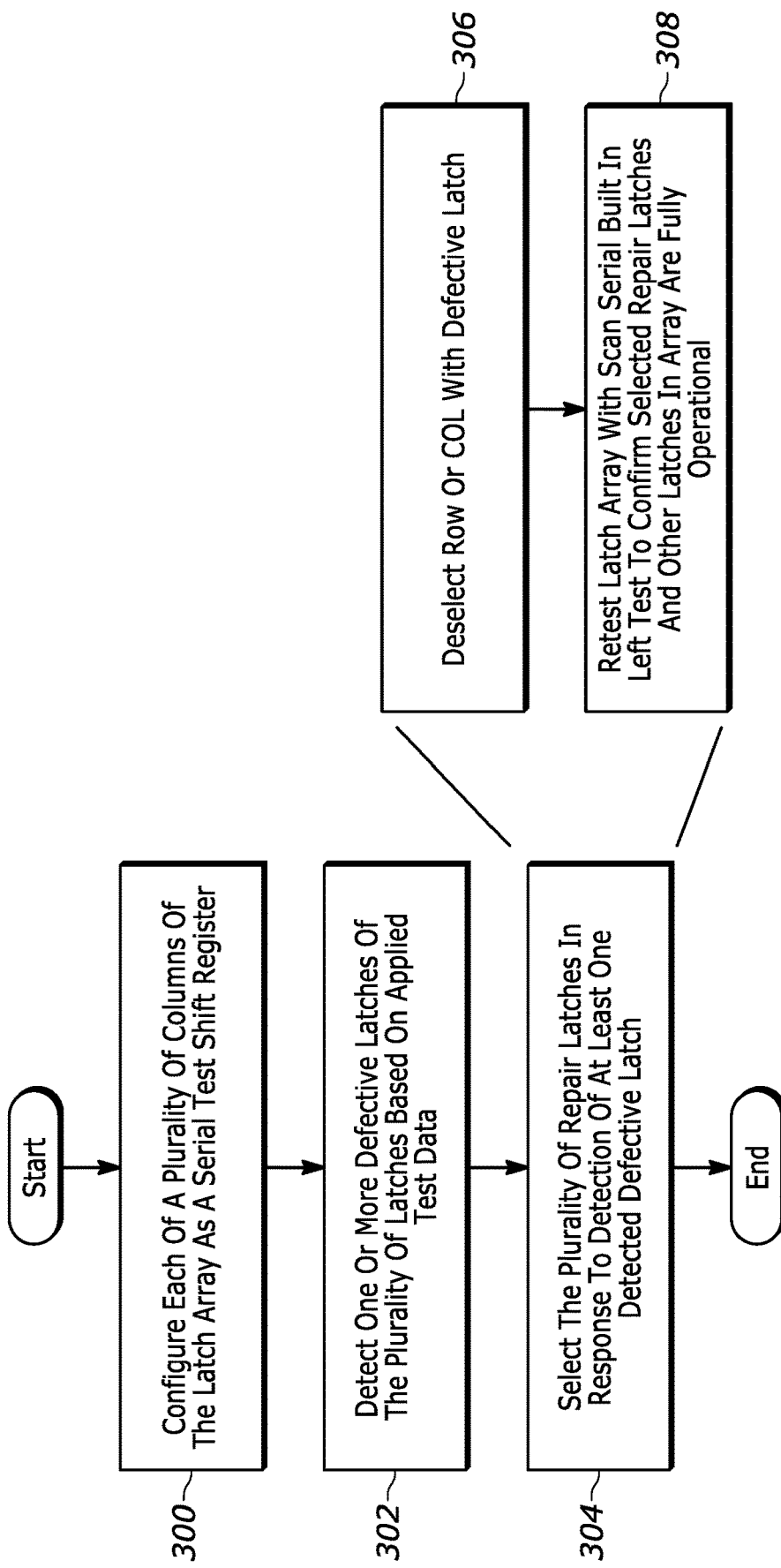
FIG. 3 is a flowchart illustrating one example of a method for controlling a latch array in accordance with one example set forth in the disclosure.

FIG. 3 illustrates an example of a method of operating a repairable latch array having a plurality of latches logically configured in rows and columns in accordance with one example. In this example, the operations are carried out by the latch array built-in self-test and repair logic 200 examples of which are further illustrated in additional figures below. It will be recognized that the operations illustrated in methods disclosed herein may be done in any suitable order and by any suitable component or components.

The operation of block 300 in one example is performed by the latch array built-in self-test and repair logic by, for example, enabling the built-in self-test scan operation. As shown in block 302, the method includes detecting one or more defective latches of a plurality of latches in the latch array, based on applied test data. In one example, the latch array built-in self-test and repair logic 200 utilizes the output of the test data comparator and when a failure occurs, the latch array test and repair controller begins the repair process. As shown in block 304, the method includes selecting the repair latches in response to detection of at least one detected defective latch. In one example, the latch array test and repair controller 204 issues the repair control data and the latch array repair logic selects repair latches to replace one or more of those that are defective. In one example, an entire row of latches is replaced, in another example an entire column of latches is replaced by a column of repair latches.

In one example, selecting the plurality of repair latches in operation 304 includes, for example, deselecting a row or column with a defective latch as shown in block 306 and as shown in block 308, retesting the latch array to confirm selected repair latches are non-defective and that other latches in the array are fully operational. As described below, this can be done in any suitable manner and in one example, is done in some implementations by testing all rows or columns in a latch array or testing each row or column in a latch array and performing the repair on a row by row or column by column basis as opposed to testing the entire latch array and then performing repair.

Figure 4A:
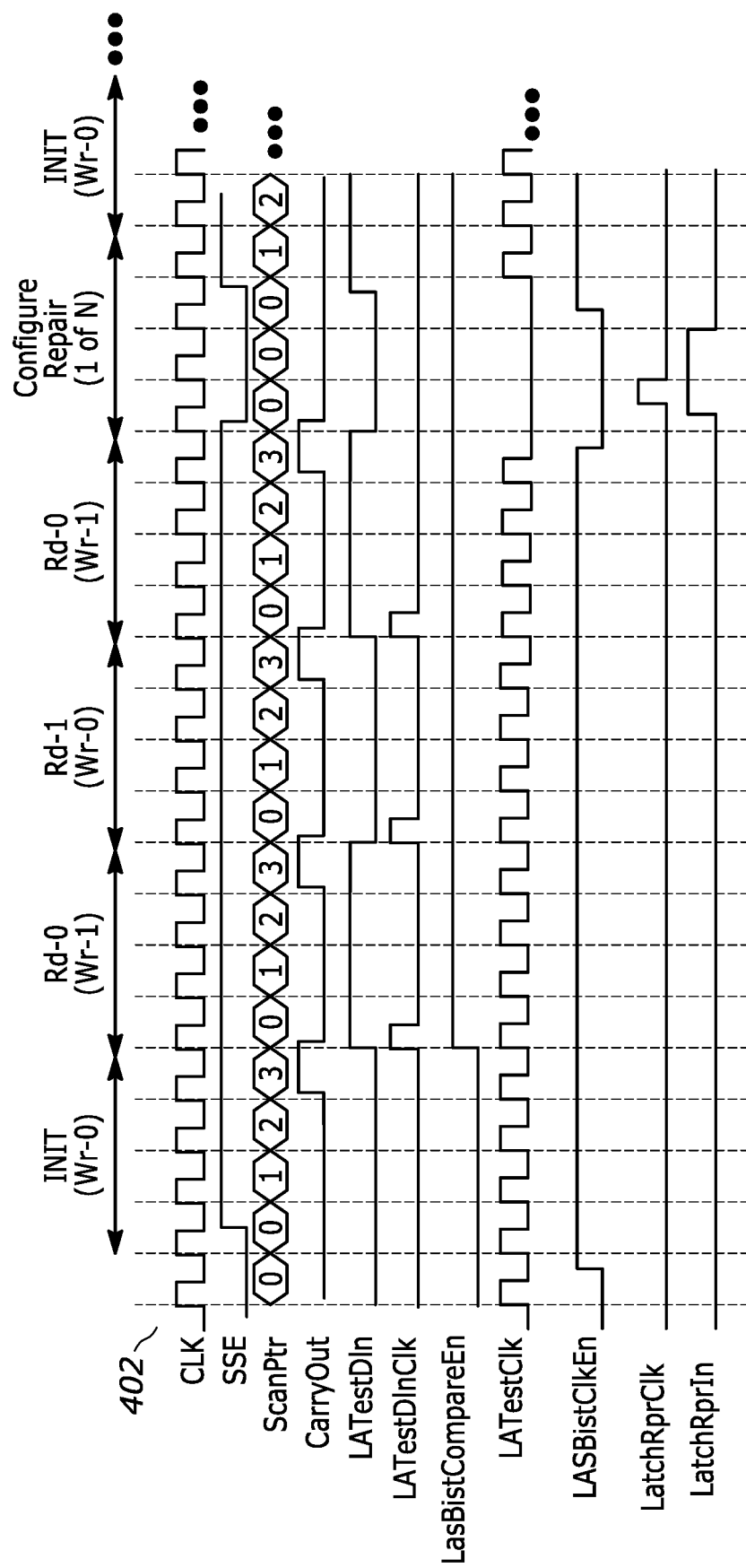
FIGS. 4A, 4B and 5 illustrate one example of a latch array with built-in self-test and repair logic that provides row repair in accordance with one example set forth in the disclosure.
Figure 4B:
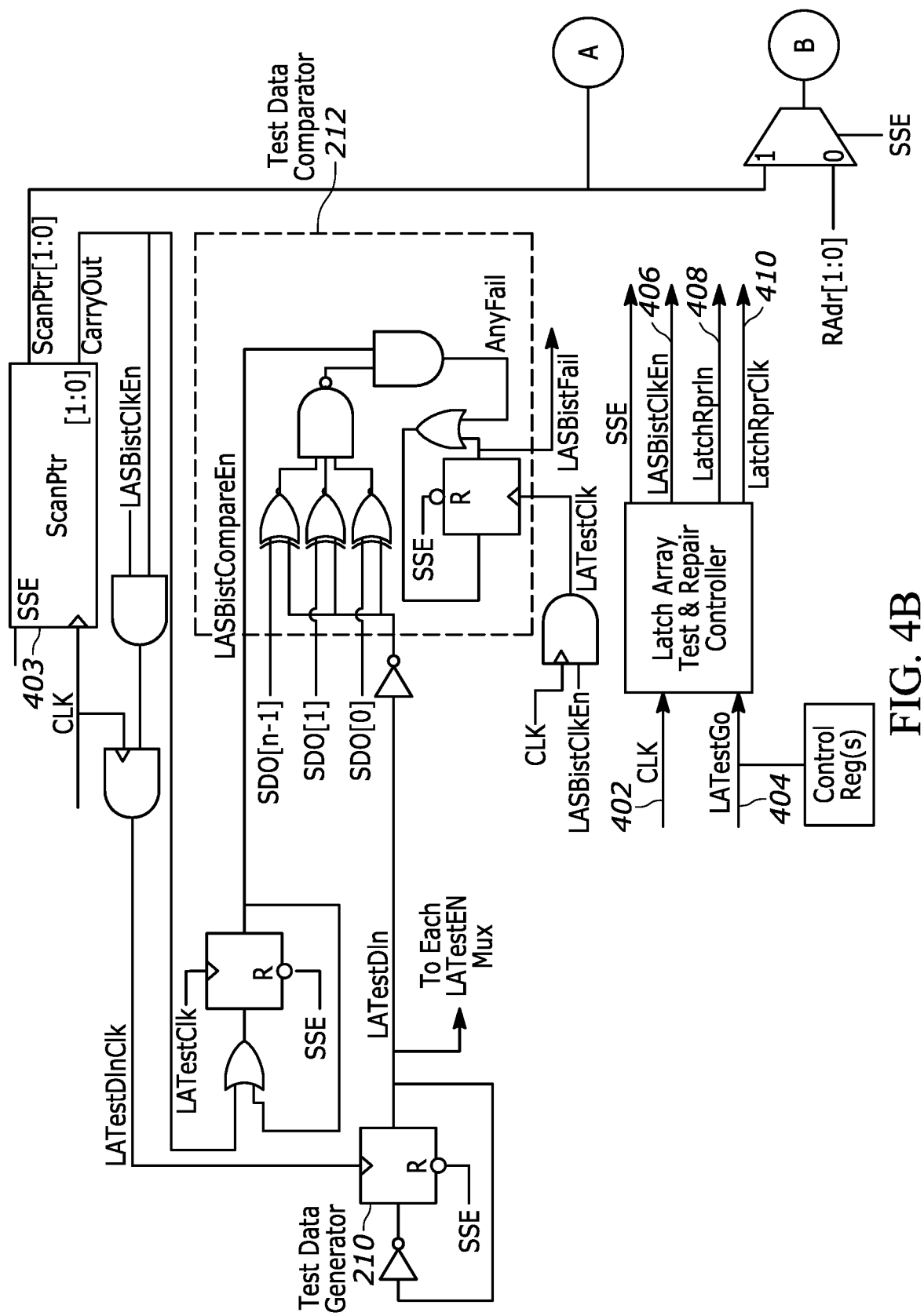
Figure 5:
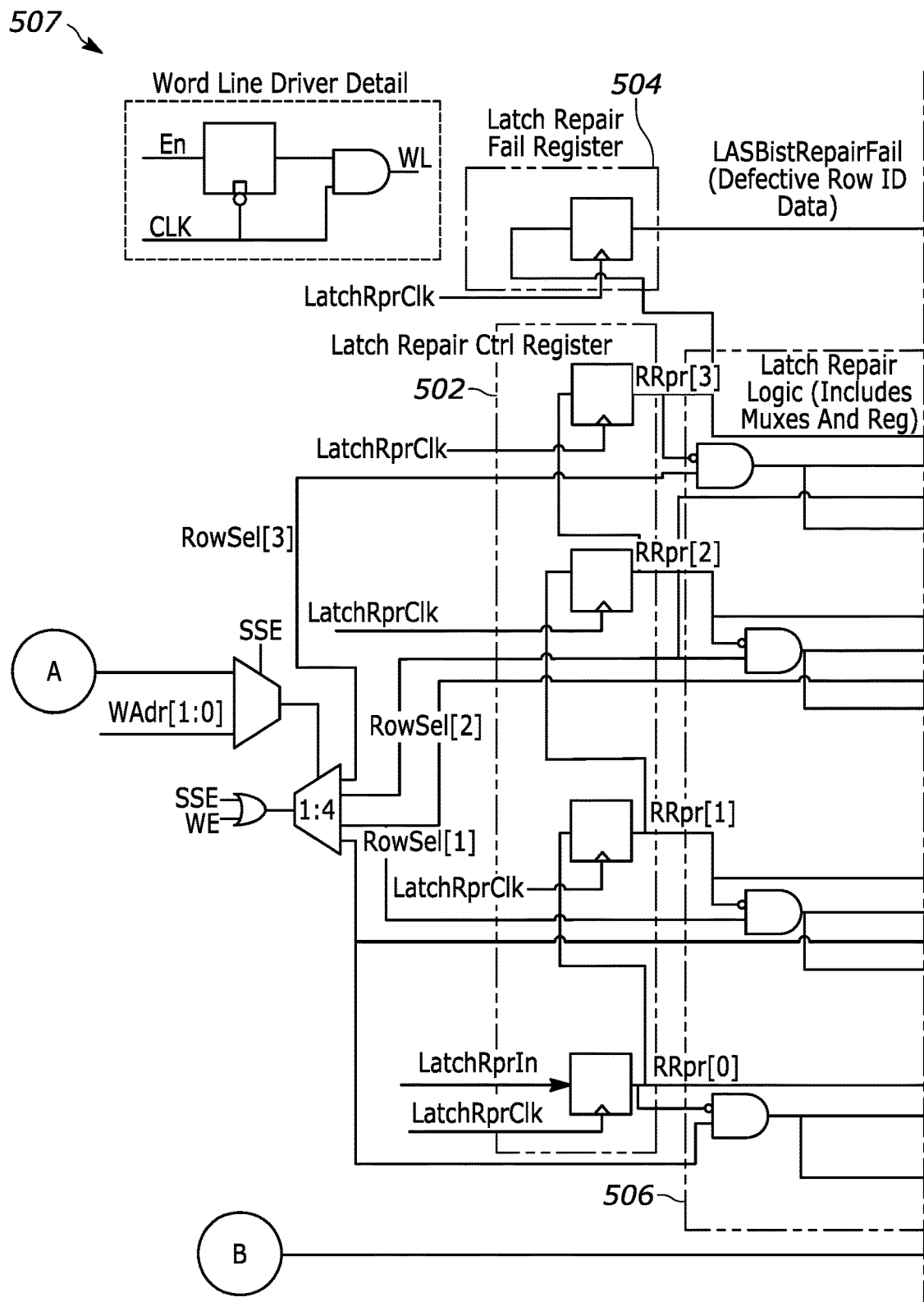
Figure 5:
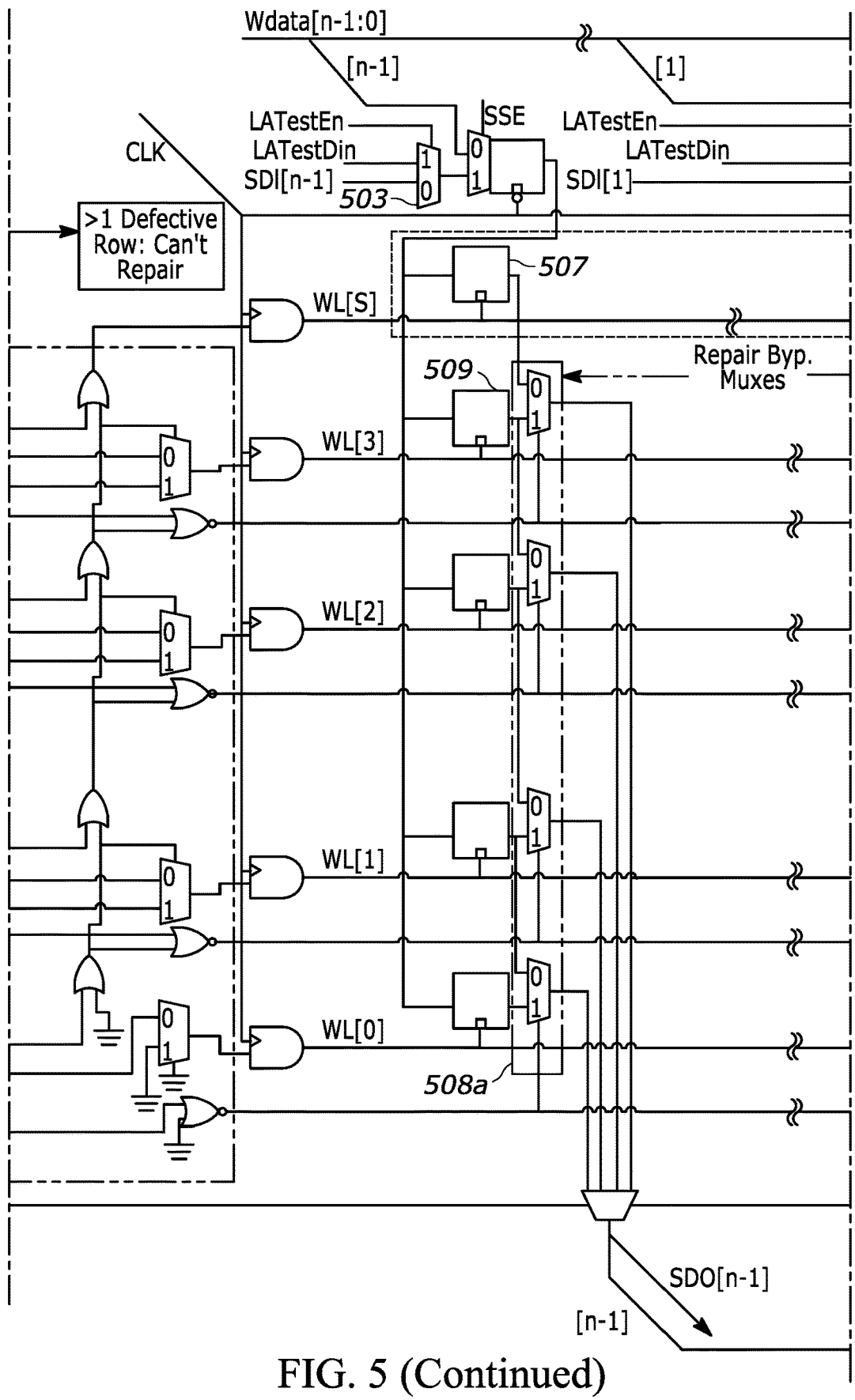
Figure 5:
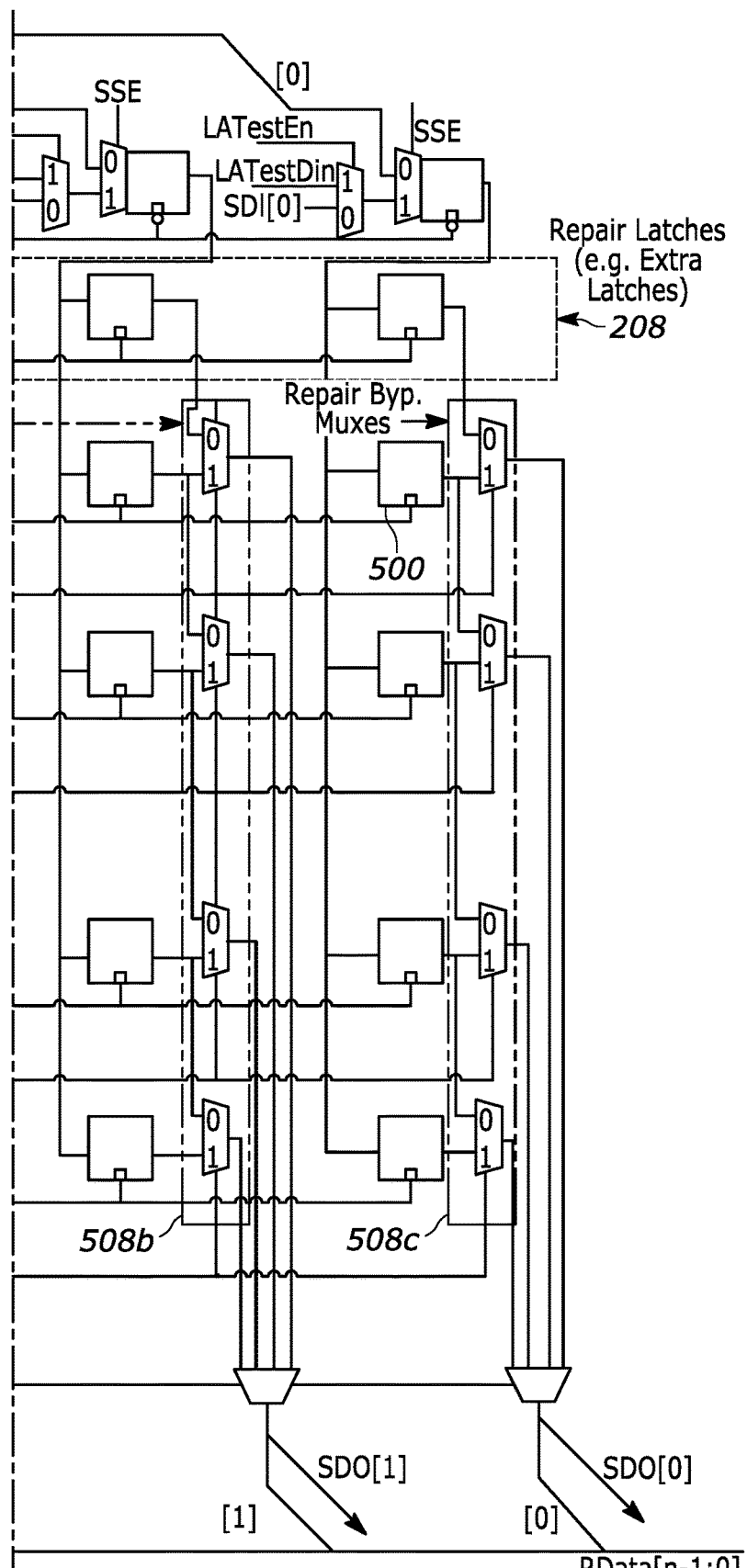

Referring also to FIGS. 4A, 4B and 5, an example of a latch array built-in self-test and repair logic operation that replaces a row of latches wherein at least one of the latches is detected to be defective will be described. As shown in block 300, the method includes configuring each of a plurality of columns of the latch array as a serial test shift register, similar to that shown in FIG. 1. This may be done, for example, by the latch array test and repair controller initiating a test operation. The controller configures each column as a serial shift register as noted above and the output of each serial shift register is passed to the comparators.

FIG. 4A is a timing diagram illustrating one example of signaling used during the built in self-test operation and one example of signaling for the latch array built-in self-test and repair logic. As shown, the latch array test and repair controller 204 receives a clock signal 402 from a suitable clock source, and a latch array test go signal 404 such as from a control register or other source to initiate the built in scan test and latch array built-in self-test and repair logic. The latch array test and repair controller 204 generates the SSE signal and latch array serial BIST clock enable signal 406, a latch repair in-signal 408 and a latch repair clock 410. In some implementations, the LatchRprClk will pulse once for every repair configuration. It is, in effect, the clock which moves the logical-1 value from the RRpr[n] flop in a lower row to the row above. The LatchRprClk does not pulse while a repair configuration is being tested. In certain implementations, LatchRprClk only pulses once, after a repair configuration has been tried, and before the next repair configuration (if any) is about to be tried. The LatchRepairin signal insert a logical 1 into the RRpr[0] flop while LatchRprClk is a logical 1 as shown.

As shown in this example, the latch array built-in self-test and repair logic 200 is shown to include spare latch array elements 208 which in this example is a row of repair latches forming three columns. The operation illustrated herein is a row repair operation, as opposed for example to a column repair operation shown and described later herein. As with the other latch array elements shown as latch elements 500, an additional four rows and three columns make up the latch array. The scan test logic illustrated in FIGS. 4B and 5 are similar to those shown in FIG. 1 but include modifications such as a scan pointer 403 and other logic. In some implementations, the scan pointer 403 is a 2 bit pointer but can be any suitable size depending on the size of the latch array, for example a latch array may have a 10 bit scan pointer, and has a carry out signal which is used for test data in. Carry-out is generated when the counter has reached its maximum count value. It is used to indicate that the latch array is fully-initialized, and thus comparisons can be done by test data comparator 212. In this example, comparisons are done until the carry bit is set, because until that time, the array has not yet been initialized.

The clock (LATestDinClk also referred to as LATestCLK) is pulsed every four cycles for a 2 bit scan pointer for example. The scan pointer sequentially selects each row in the latch array during a test mode to load on-chip test data in the serial test shift registers (e.g., rows of latches). The scan pointer indicates/selects which bits/latches are sequentially access during the test phase. Hence, the latch array self-test logic loads on-chip test data into the configured serial test shift registers on a row by row basis. The scan pointer 403 employs a counter to generate an address to sequentially load test data into each row. In this example, the address pointer cycles thru all of the address values, but when a defective row is identified, it is not used, and instead, the row above it is used.

In this example, the latch array serial built-in self-test and repair logic 200 includes latch array repair logic that is operatively coupled to the repair latches and the non-repair latches of the latch array. In this example, the latch array repair logic 206 includes the latch repair control registers 502, latch array test in muxes 503, the latch repair fail register 504, latch repair logic 506 and the repair bypass muxes 508A-508C. The muxes 503 select between test data coming in from SDI and test data coming from the LA Test circuit, shown as LATestDin.

Each latch of the latch repair control registers 502 indicates whether its associated row is good/bad. If the row is bad, then the row immediately above is used in place of the defective row and likewise all other rows including the spare row will be access in place of the row below them. The latch repair fail register 504 will start at logical-0, and it will only be set to logical-1 if all possible repair configurations have been tried but have failed. Its function is to indicate that the latch array is unrepairable. To illustrate this, imagine that the flip-flops in 502 and 504 will be initialized to all zeros before test and repair begins. A 1 value will be shifted into the bottom-most flop, i.e., RRpr[0]=1. Then the test will be run. If it passes, it is inferred that the bottom-most row was faulty, and the spare row is good. If it fails, then the 1 value is shifted into the RRpr flop above it, so RRpr[1]=1. The test is then re-run. If it passes, great; if it fails, a shift is done again and the test is rerun, all the way up to the top-most row. If assuming that row is bad (i.e., by setting RRpr[3]=1 in the case of a 4-row array) then all possible repair configurations have been tried and have not resulted in a passing test. And thus, in that case, the bit in 504 will be set, and the device is deemed unrepairable.

The latch repair logic 506 interfaces with control registers and the bypass muxes to select and deselect rows of latches. The repair bypass muxes 508A-C account for the repairs in the read data path. If they did not exist, then it would be possible to read from a bad row. In some implementations, a bypass mux is coupled to receive an output from a repair latch 507 in a repair row and an output from a non-repair latch 509 in a non-repair row. In certain implementations an output of a bypass mux provides output data to a column level read mux. In some implementations each bypass mux is coupled to a plurality of sequential rows of latches in the latch array. In some implementations, outputs of the bypass muxes are configured in a column format and pass data to a common read mux for a column. For example, in FIG. 5, the latch array repair logic includes at least one bypass mux configured to bypass a defective row that includes at least one defective latch. For example, in the example shown on FIG. 8 below, the latch array repair logic includes at least one bypass mux configured to bypass a defective column that includes at least one defective latch.

In operation, the latch array built in self-test and repair logic shown in FIG. 4B and FIG. 5 attempts to repair all row configurations in sequence until the entire latch array passes the self-test. It will be recognized that only one latch array is illustrated and that the logic that performs the self-test and latch repair can be included in multiple latch arrays or all the latch arrays on a chip as desired. It will also be recognized that any suitable sized latch array may be employed.

Figure 6:
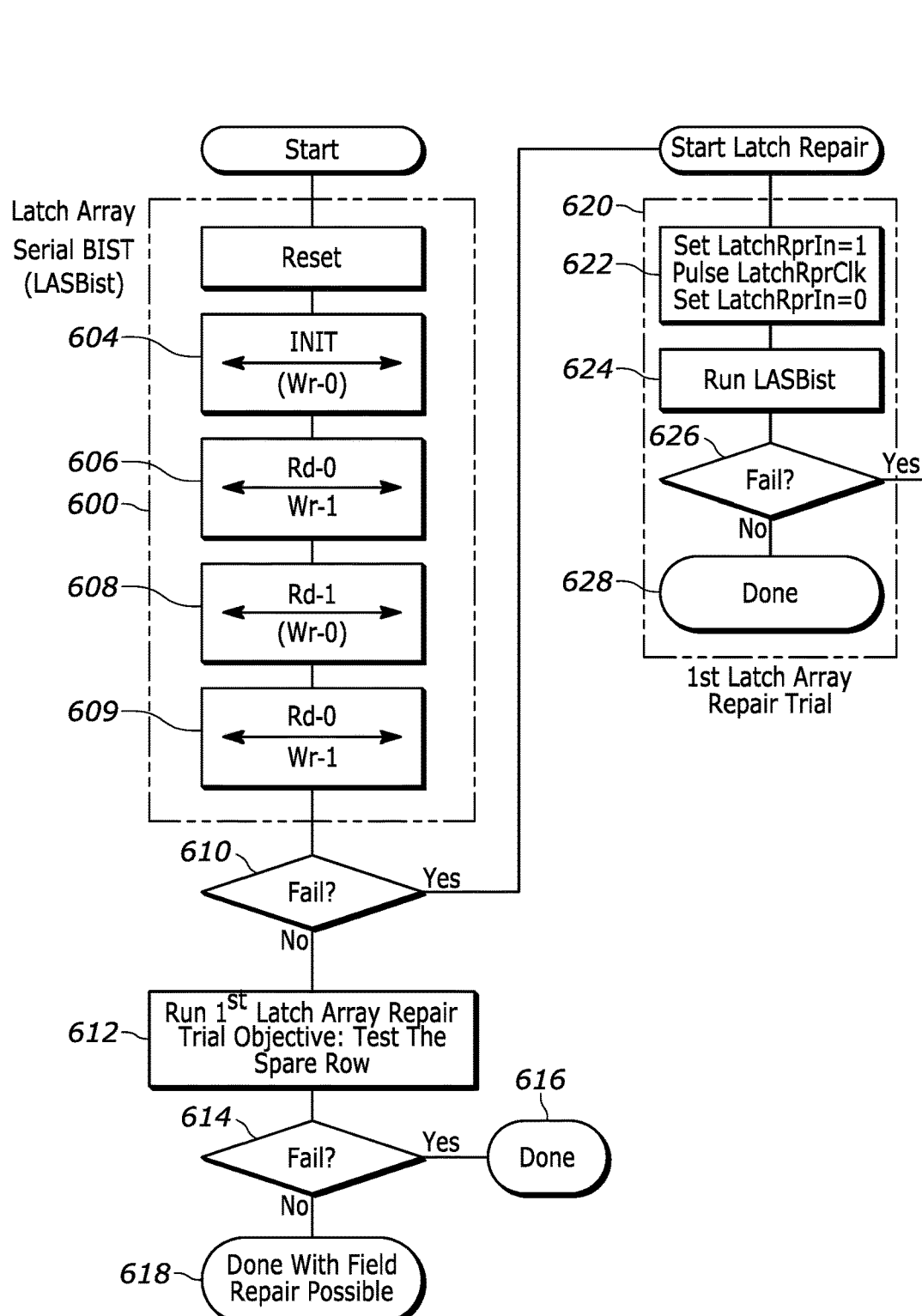
FIG. 6 is a flowchart illustrating a method for providing latch repair in accordance with one example set forth in the disclosure with reference to FIGS. 4 and 5.
Figure 6:
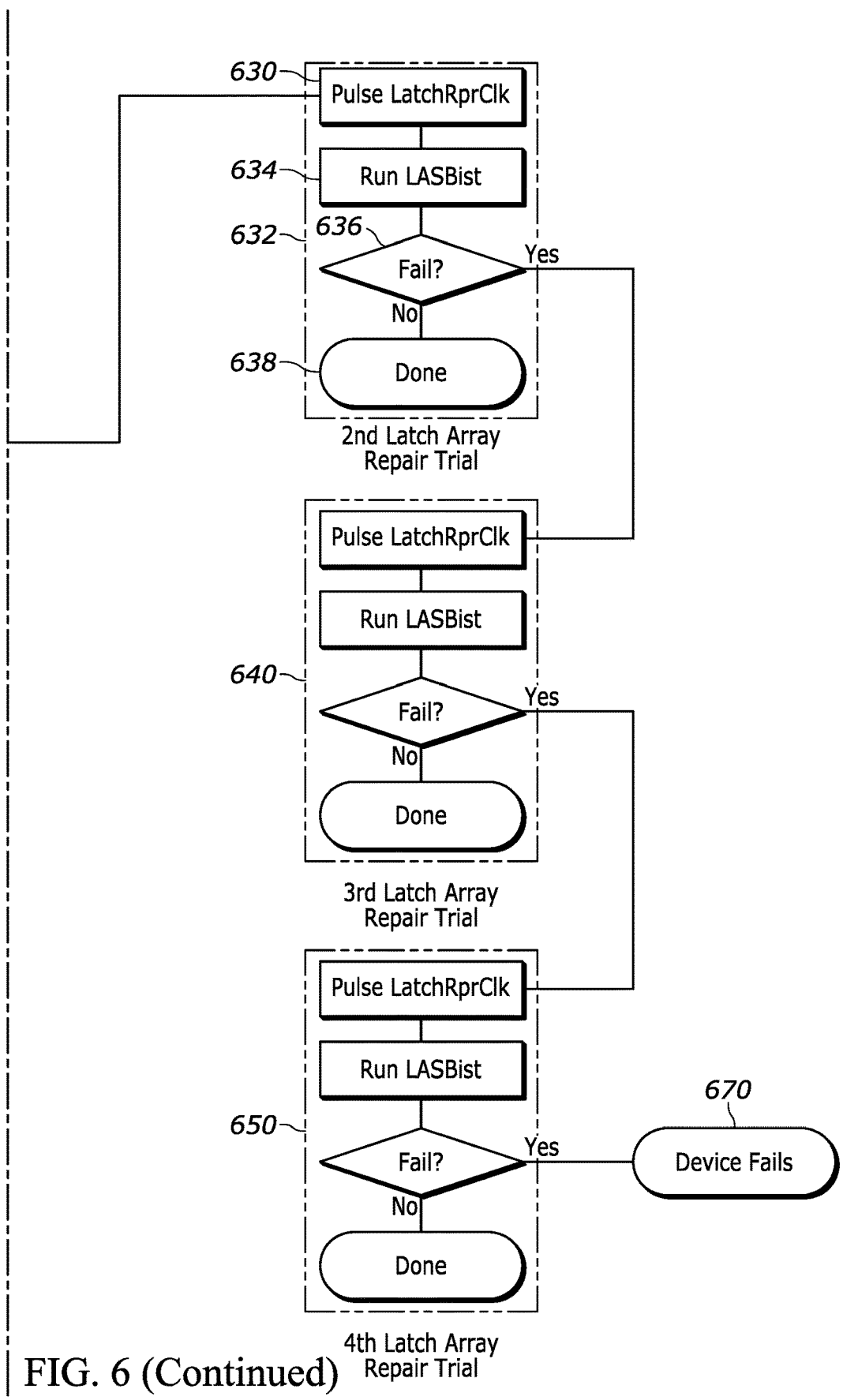

FIG. 6 illustrates a method of operating a latch array that is carried out, for example, by the latch array serial built-in self-test and repair logic 200 shown in FIGS. 4A-5. However, any suitable structure may be employed. In this example, the method includes initiating the latch array including the repair latches. As shown by dashed block 600, the latch array test and repair controller initializes the latch array and performs the scanning in and scanning out of test data and as shown, the latch array with built-in self-test and repair logic is reset as shown in block 602 and as part of the initialization operation zeros are written to the latch array elements including the repair latches as shown in block 604. Read and writes are then scanned in and out as shown, such as data is read to be zeros and then data for the latches is written to be ones as shown in block 606. The write data that was set to a "1" is then read out in block 608 and write data with the logic "0" is written into the latches including the repair latches and as shown in block 609, the data that is expected to be zeros is read out and "logic ones" are written into the latches so that the latches are suitably toggled for testing, as known in the art. If the test data comparator 212 compares the scan in data to the scan out data and if there are only matches, then no failure has occurred as shown in block 610. Stated another way, in block 604, a background pattern is written, in this case all zeros. In block 606, that background pattern is first read, and then another pattern, in this case all ones, is written. In block 608, the apparatus reads ones and write zeros, and in block 609, the opposite is done. By doing all of the above steps, the test has demonstrated that ones and zeros can be written to every row in the array and then read back correctly. It will be recognized that other test patterns can be used such as a checker board pattern to check impacts on neighboring latches.

As shown in block 612, the method includes running a first latch array repair trial to test the spare row. In one example, the spare row(s) can be tested by falsely marking one of the original rows as defective. This is accomplished by comparing that row's data value against the opposite of the value which is actually expected, thereby forcing it to be marked as a bad row. In that case, it will result in the spare row's being tested. This sequence can be repeated to test multiple spare rows as desired. When the spare rows are not defective an in-filed register is set indicating that spare rows are available for use in-field repairs. Alternatively, a clock (word line) for the spare row could be activated independently, and its data values could be read by forcing the read mux select lines such that the spare row's data values are read out from the array.

As shown in block 614, if there is a failure of the latch arrays, the testing is done, meaning that there is no available spare latch array to use for repair. This is shown in block 616. However, if there is no failure of the repair latches, then as shown in block 618, the test of the latch arrays is completed and in-field repair is indicated as being possible by, for example, setting a flag or bit in a control register. When in-field for example, a controller or processing circuitry checks the register or flag and if set to indicate in-field repair is available, initiates the latch array built in self-test and repair logic. Stated another way, a test is done and if no failures occur in both the non-repair latches (e.g., latches in a conventional latch array) and the repair latches, then field repair is indicated as being possible so that the latch array with built-in self-test and repair logic can be run when the chip is in the field to repair latch failures automatically on the fly based on a predetermined interval, during power up operations or in response to other conditions when the chip is in field.

When, however, a failure has been detected as shown in block 610 wherein latches in the standard latch array, not in the spare latches, as shown in blocks 620, the method includes starting the latch repair. As shown in block 622, the method includes setting the latch repair in (LRprin) to logic one, pulsing the latch repair clock and setting the latch repair in to zero, which is done, for example, by the latch array test and repair controller 204. In some implementations, the latch array test and repair controller 204 is implemented as one or more state machines. In other implementations, the latch array test and repair controller 204 is implemented as a controller executing firmware, however any suitable logic may be employed. As shown in block 624, the method includes running the latch array serial built-in self-test which is shown in block 600 and if no failure is detected as shown in block 626, the first latch array repair trial is completed as shown in block 628. In some implementations, the operation shown in block 600 is done without any repair latches (no spare row is tested). The operation in block 620 replaces one row with the spare row. The operation in block 630 (if required) replaces the next row with that spare row.

As shown in block 630, a second latch array repair trial is performed if the operation in block 620 failed. This is for another row in the latch array. As shown in block 632, the method includes pulsing the latch repair clock, and running a latch array serial BIST operation shown as 634 and if no failure occurs as shown in block 636, the testing for the second latch array trial is completed as shown by 638. The process continues as shown in block 640 and 650 for other rows in the latch array. In the general case, an N-row latch array may require N trials. In some implementations, the LABIST repair logic identifies which row failed based on the time in which the bad data arrived at the comparators. A counter is used to track the scan pointer value to remember the ScanPtr value which resulted in the failure.

As shown, if failures are detected in each of the repair trials, as shown in block 670, the device fails since there are not enough spare latches to correct for all of the differing rows that have been detected to have defects.

Figure 7A:
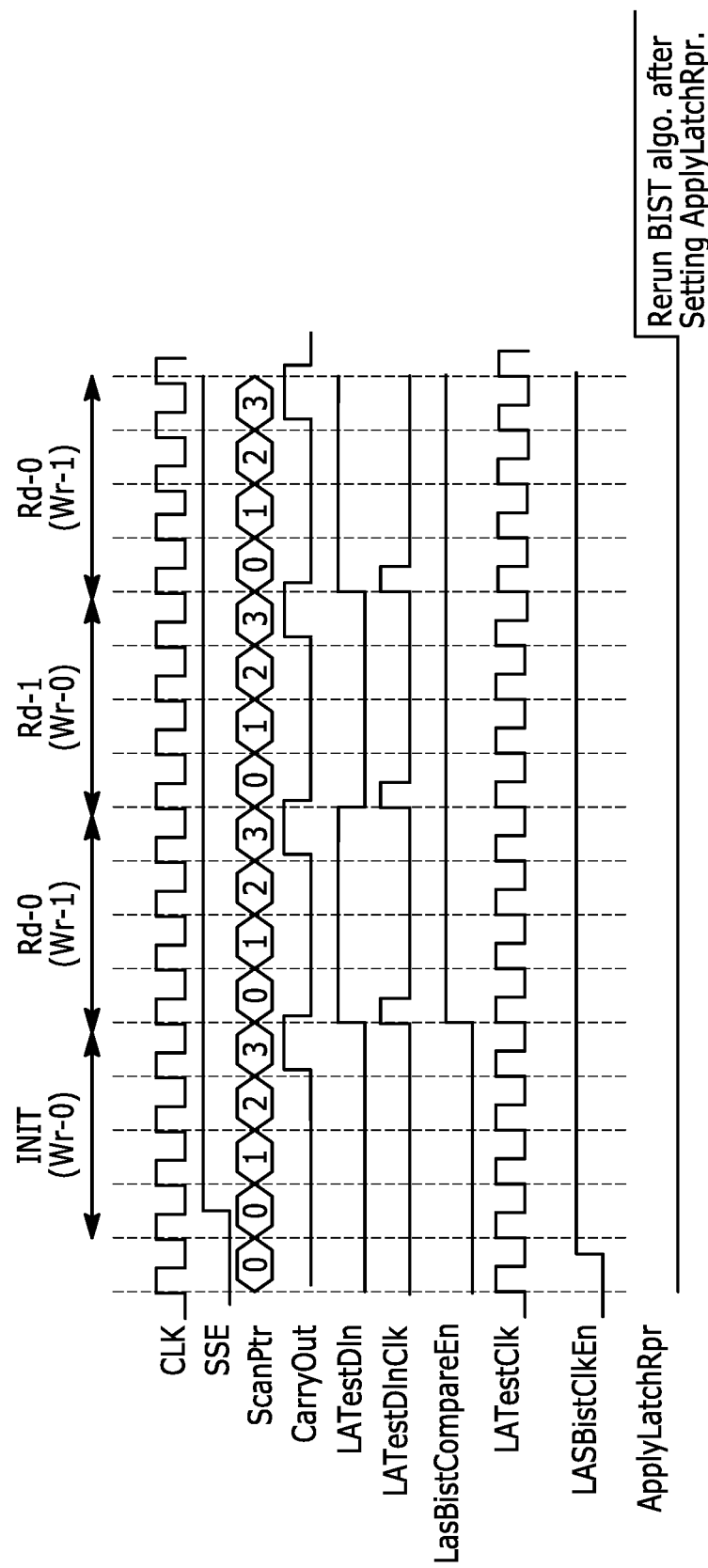
FIGS. 7A, 7B and 8 illustrate one example of a latch array with built-in self-test and repair logic that provides row repair in accordance with one example set forth in the disclosure.
Figure 7B:
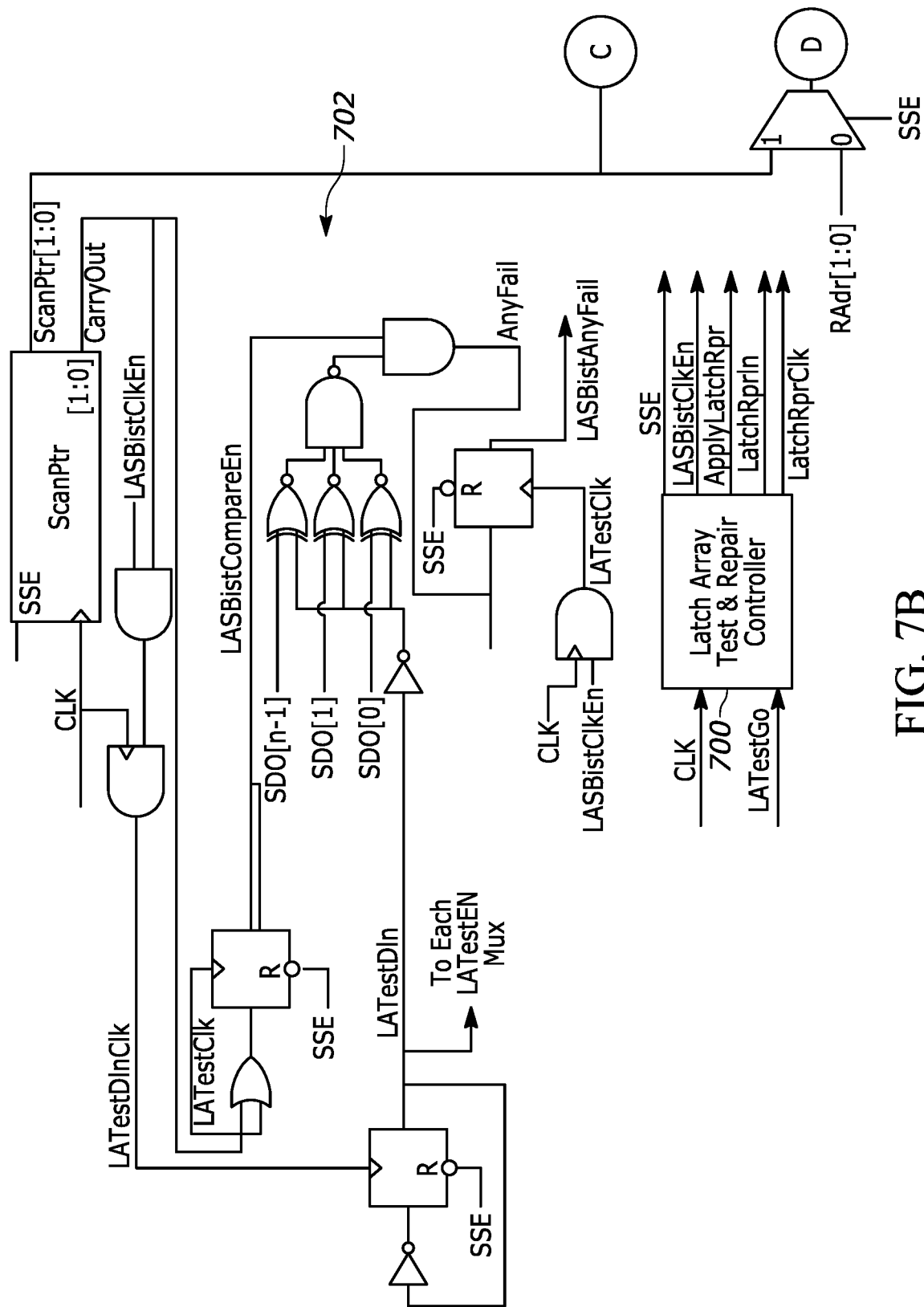
Figure 8:
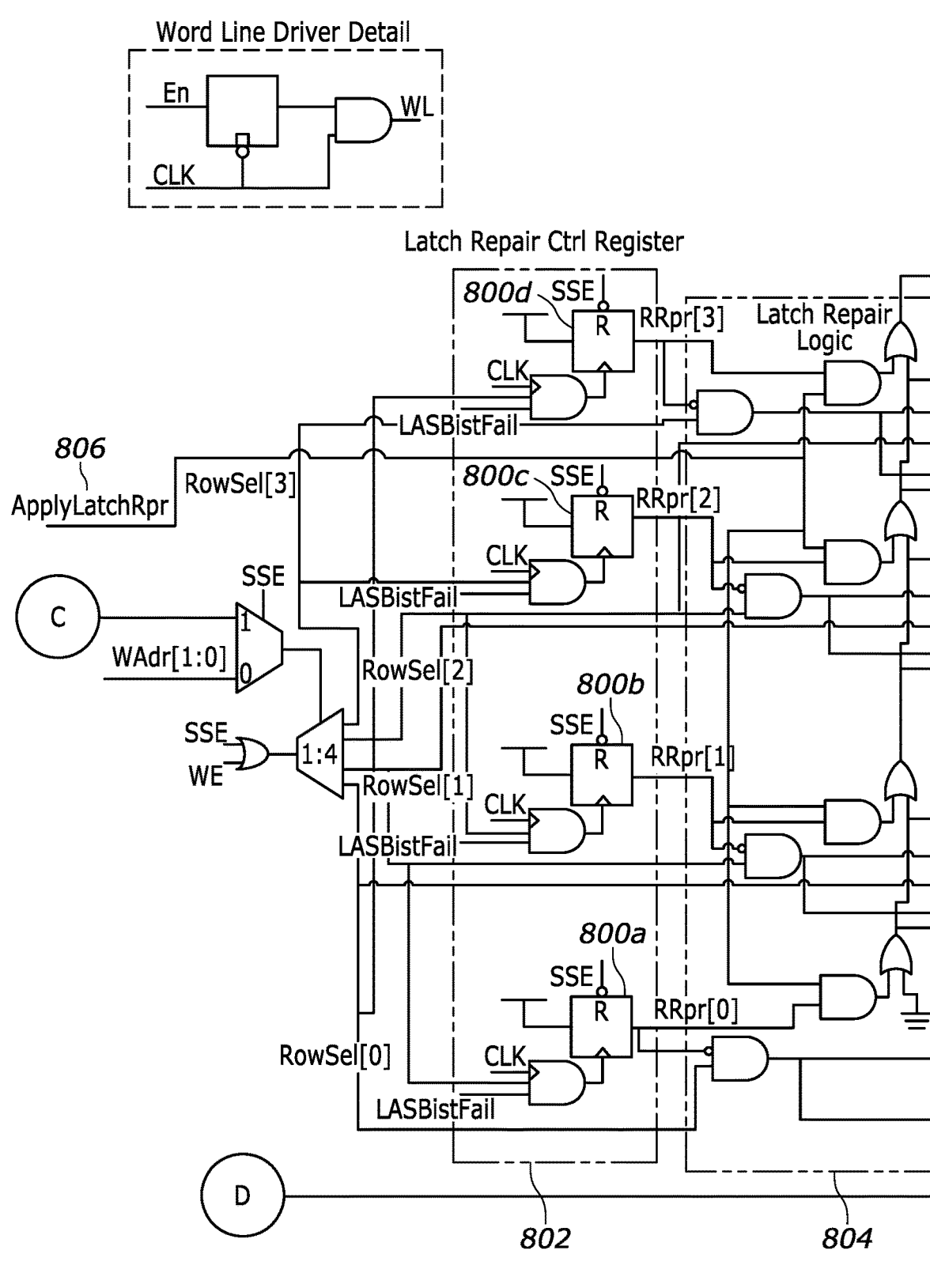
Figure 8:
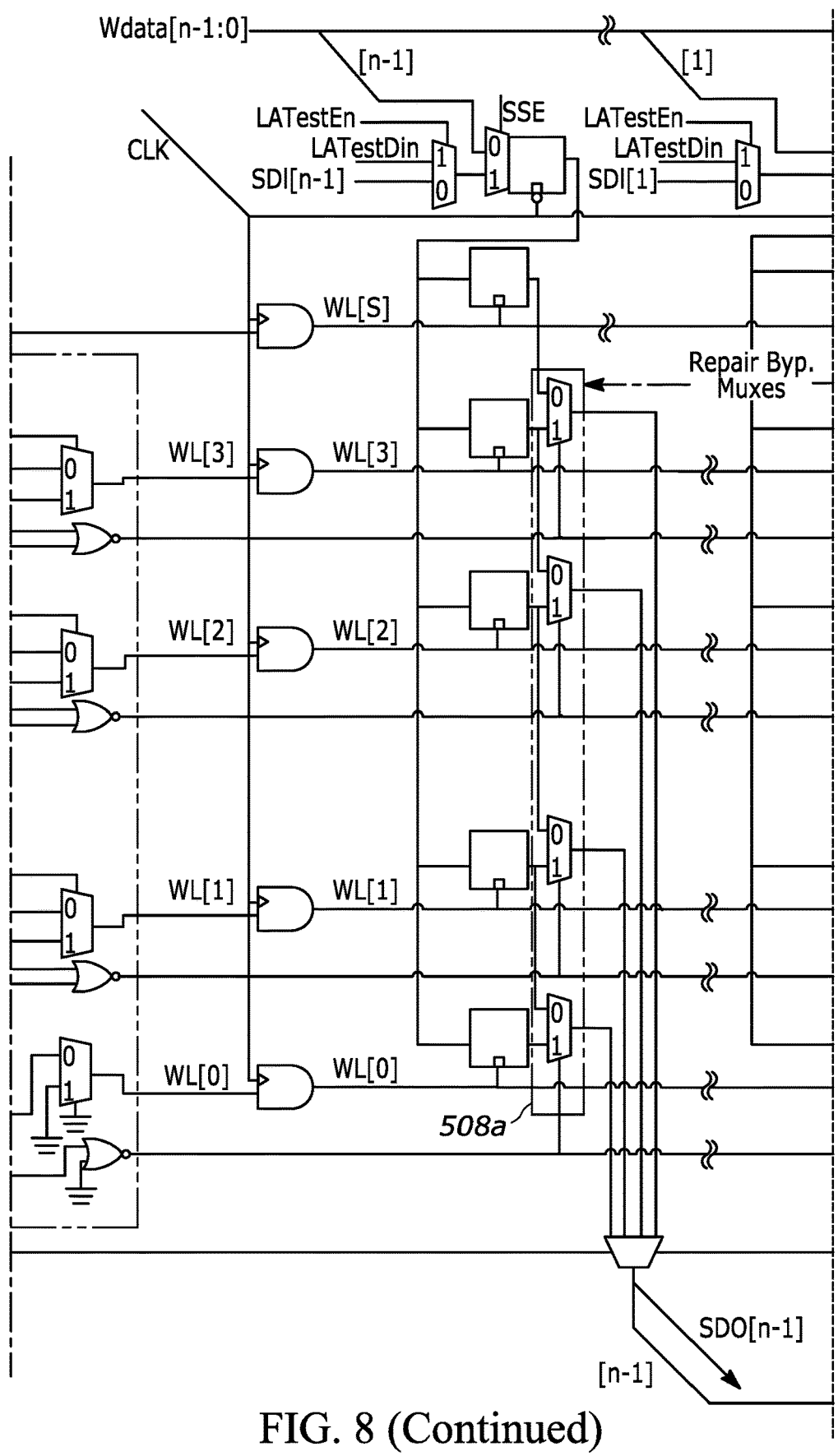
Figure 8:
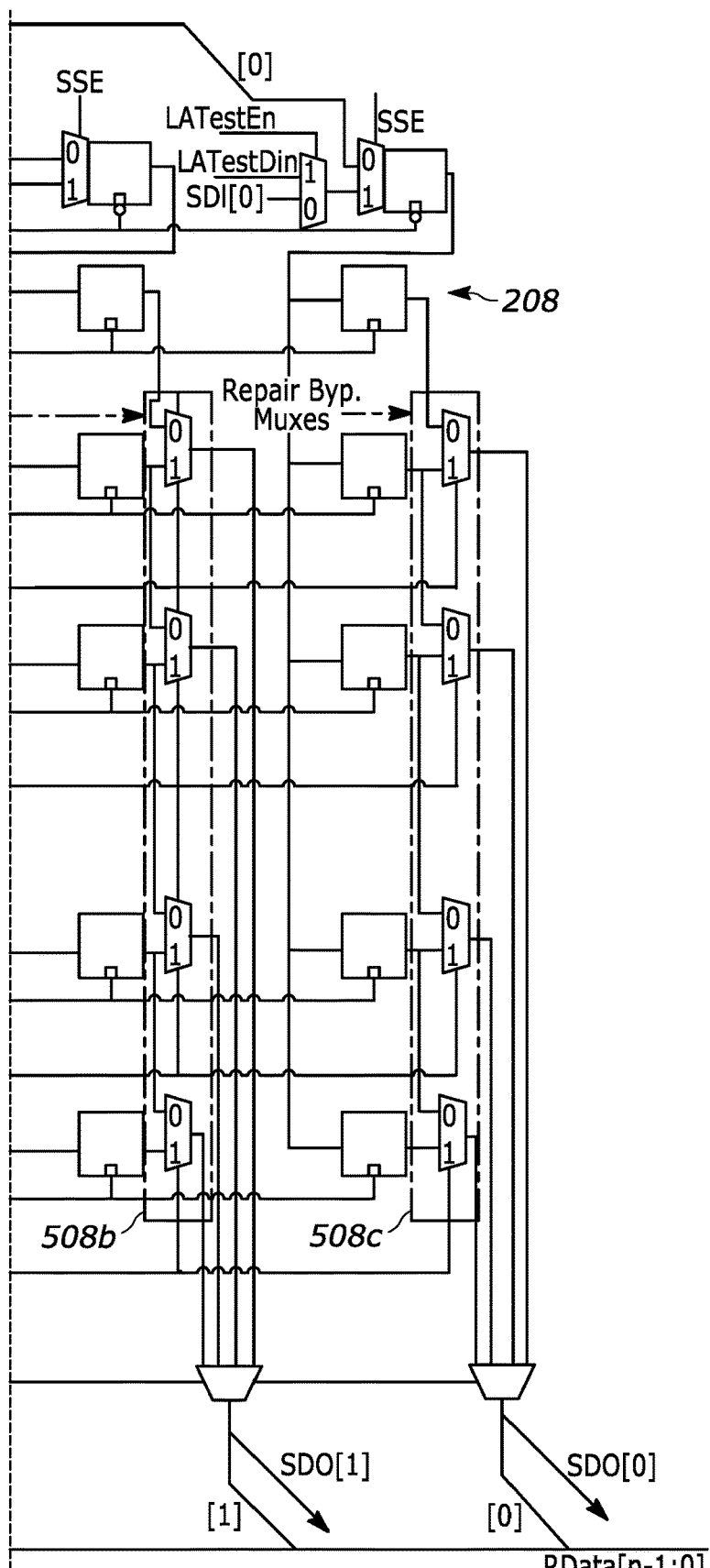

FIGS. 7A, 7B AND FIG. 8 illustrate another example of latch array built in self-test logic that performs row repair, and in this example, identifies a failing row as it is tested and sets a register repair bit (RRpr bit) 800a-800d in a latch repair control register 802 indicating the row that failed and does not employ the latch repair fail register 504 (see FIG. 5). Latch repair logic 804 is controlled by the latch array test and repair controller 700 to select a row of repair latches and bypass (e.g., deselect) the detected row that includes the defective latch. In one example control data 806 referred to as ApplyLatchRpr is set to "0" during a first pass and to a logic "1" in a second pass.

Figure 9:
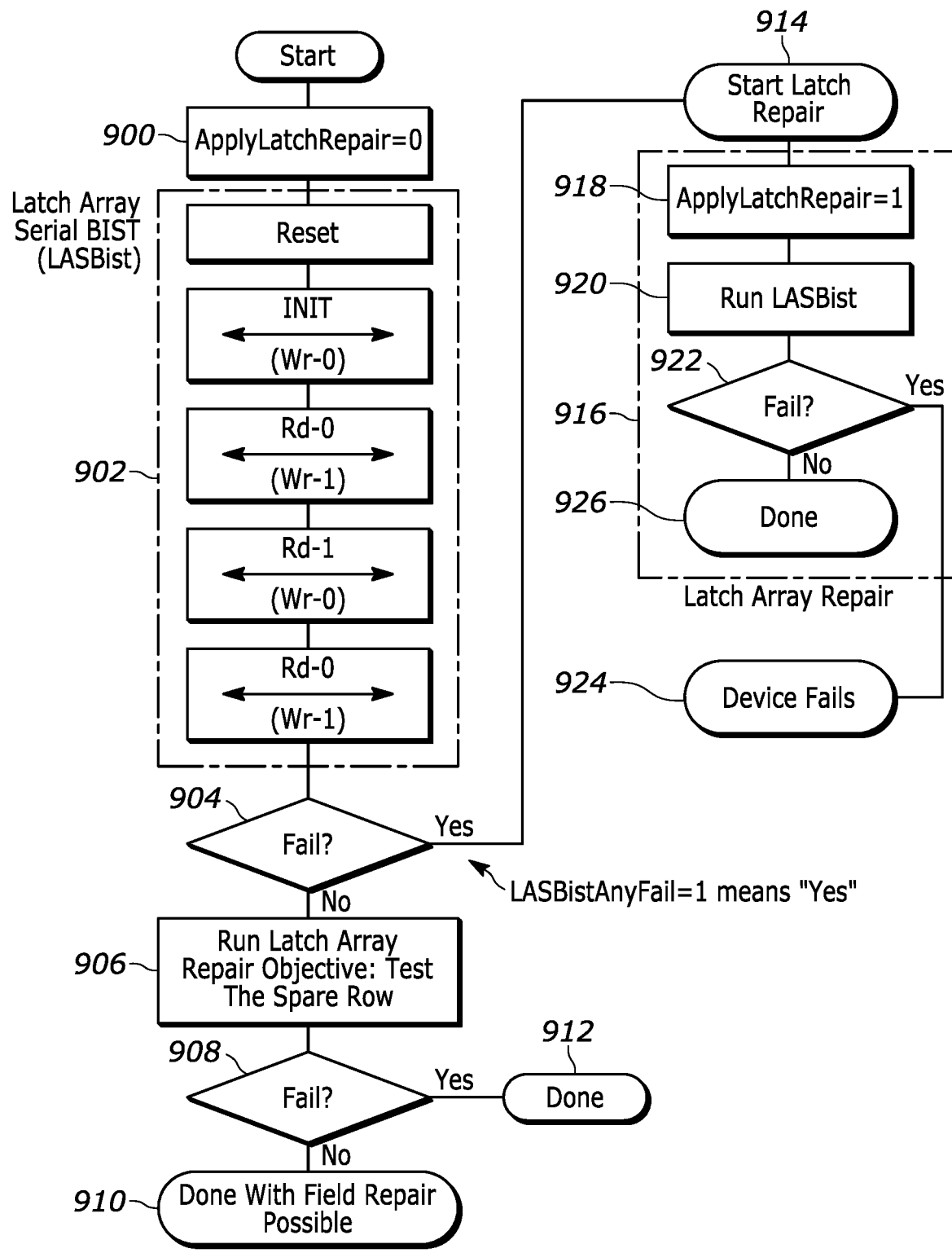
FIG. 9 is a flowchart illustrating a method for providing latch repair in accordance with one example set forth in the disclosure with reference to FIGS. 7 and 8.

FIG. 9 illustrates a method for operating a latch array during a built-in self-test and in this example, will be described with reference to FIGS. 7A-8. As shown, the method includes issuing a control signal, such as ApplyLatchRpr, to a logical "0" as shown in block 900. This is done, for example, by the latch array test and repair controller in FIG. 7B. As shown in block 902, a latch array serial built-in self-test operation is performed as previously described. As shown in block 904, the test data comparator 702 determines if any failure has been detected from any row, if no failure has been detected, as shown in block 906, the method includes testing the spare latch array elements 208. In this example, if no failure has been detected of the spare latches as shown in block 908, the test process is completed as shown in block 910 and an in-field repair bit is set in a register indicating that there are available spare rows to use for in field repair since none of the spare rows have any defects. If, however, a failure occurs for the spare row as shown in block 912, the chip is deemed usable but no repair operation can be employed.

Referring back to operation 904, if a failure of the non-spare latches in the latch array show a failure, as shown in block 914, the latch array repair operation is initiated. As shown in dashed block 916, various operations are performed. In this example, as shown in block 918, the latch array repair operation includes issuing, by the latch array test and repair controller 700, an ApplyLatchRpr signal equal to a logical "1" as the control data 806. In this alternative row repair scheme, the latch repair control registers (802) are again initialized to all zeros, but then during the test, as soon as an array fails, the LABistFail signal goes to logical-1, and if that row is the one currently being tested, then its RRpr[n] bit will be set. The ApplyLatchRpr signal will be at logical-0 during self-test, but then later, when the array is going to be tested again with the spare row replacing the faulty row, then ApplyLatchRpr=1.

As shown in block 920, the latch array serial built-in self-test, such as that shown in block 902, is performed. As shown in block 922, if the test data comparator 702 determines that a failure has occurred, as shown in block 924, the device is indicated as failed because the repair logic failed or there were insufficient repair resources. In one example this is done by setting a bit in a register. However, if no failure occurs as shown in block 926, then the repair operation has been successful. The latch array repair operation in this example sets RRpr bits for those rows that are defective and whichever RRpr bits were set during built in self-test, are enabled when ApplyLatchRpr is asserted.

Figure 10A:
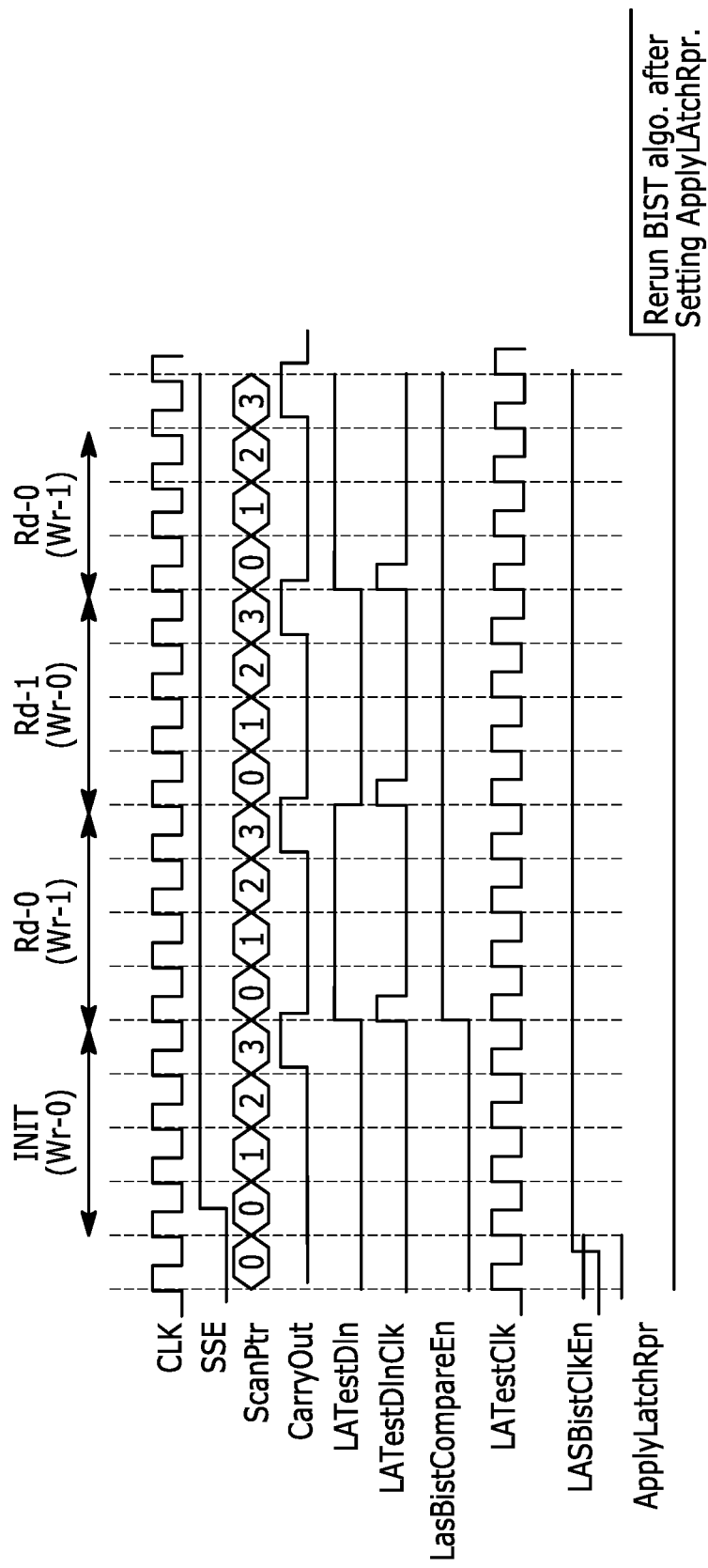
FIGS. 10A, 10B and 11 illustrate one example of a latch array with built-in self-test and repair logic that provides column repair in accordance with one example set forth in the disclosure.
Figure 10B:
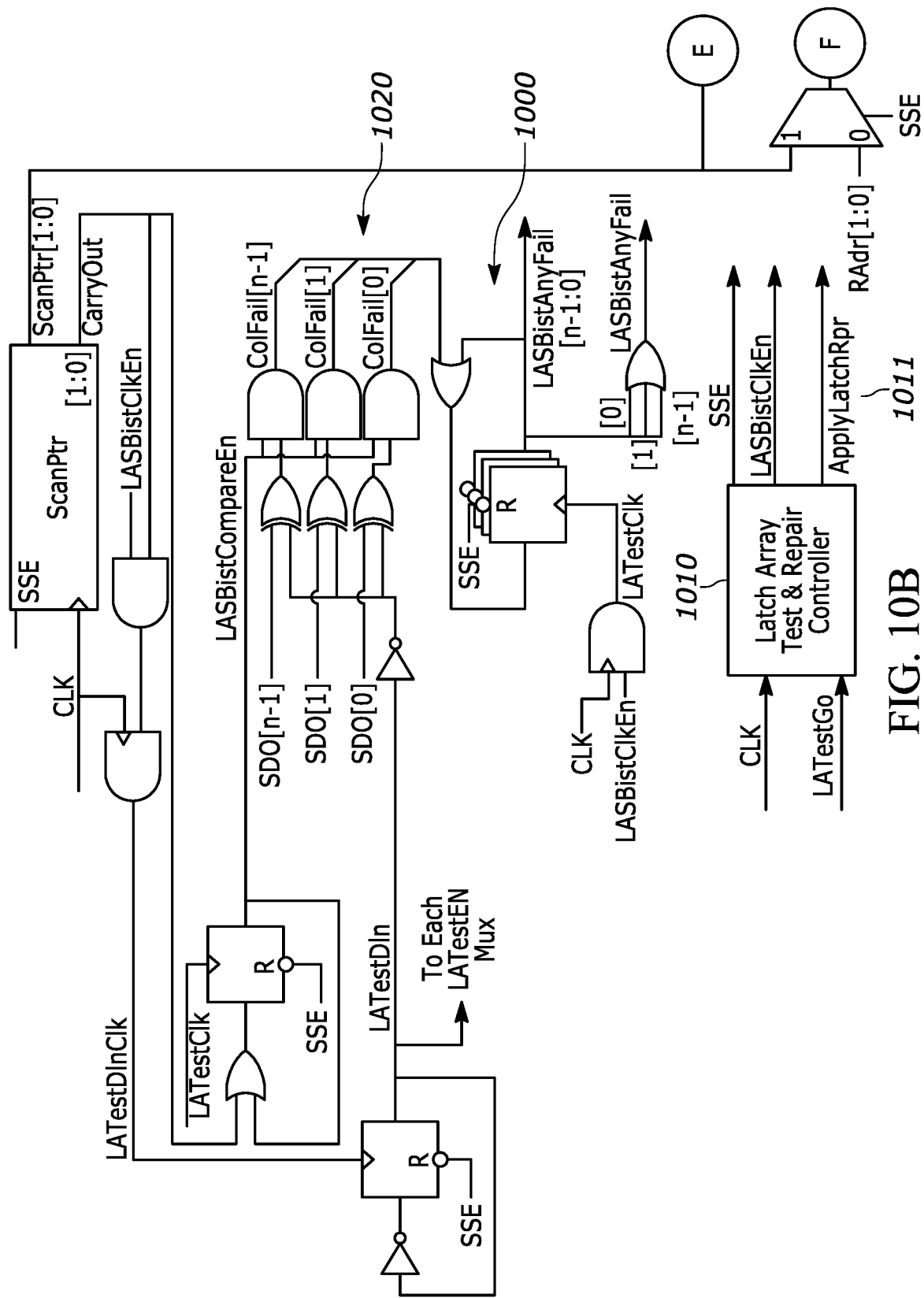
Figure 11:
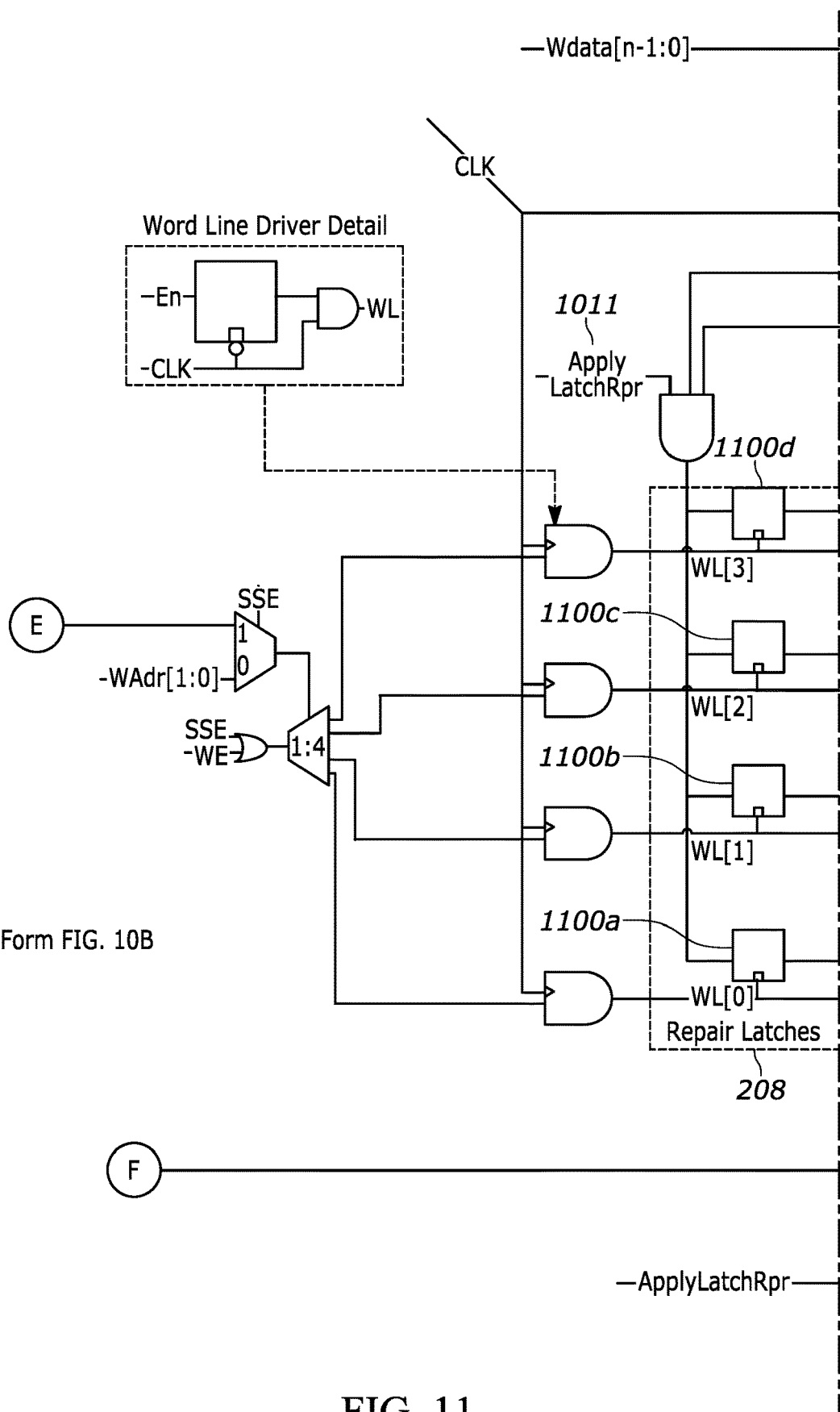
Figure 11:
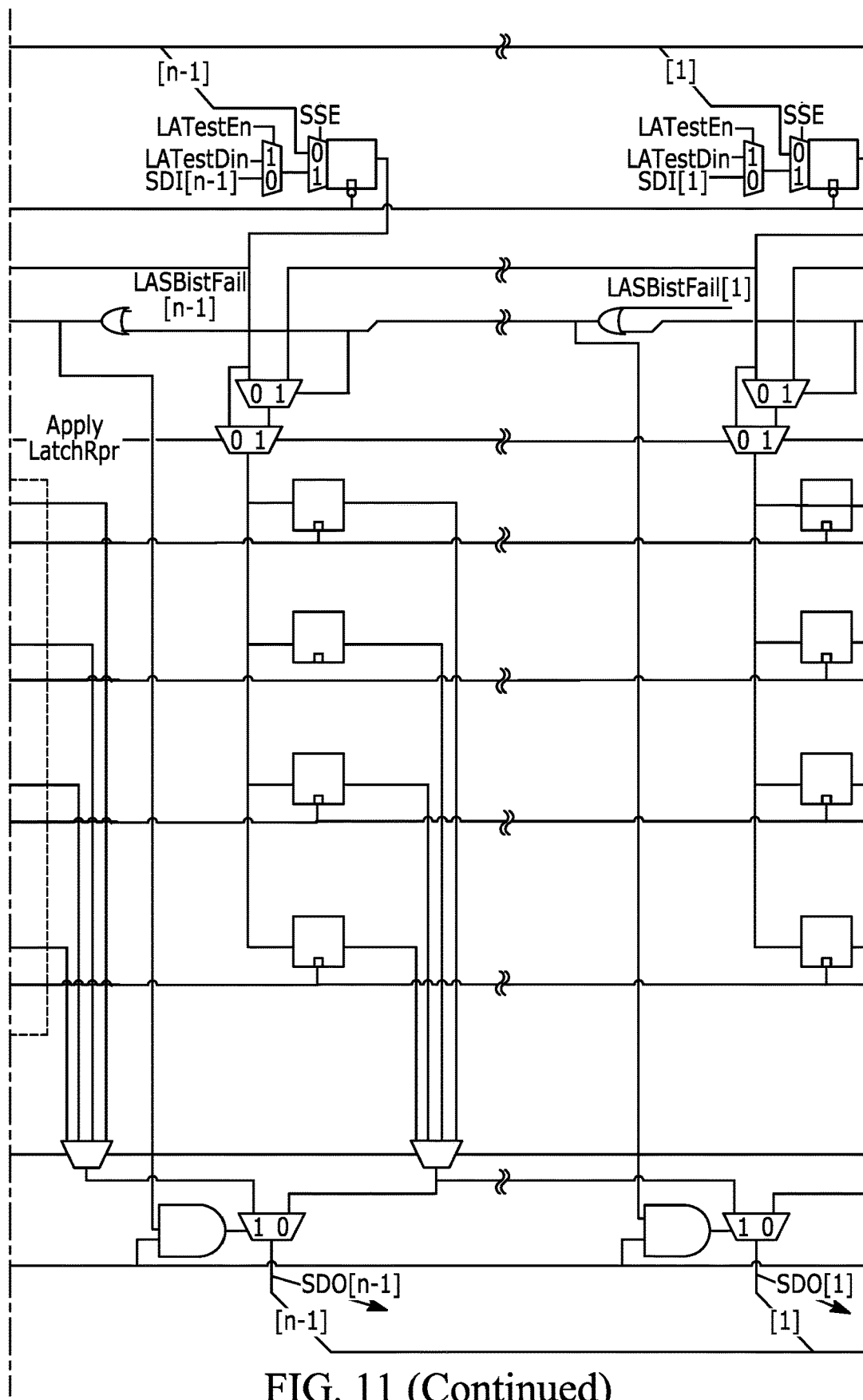
Figure 11:
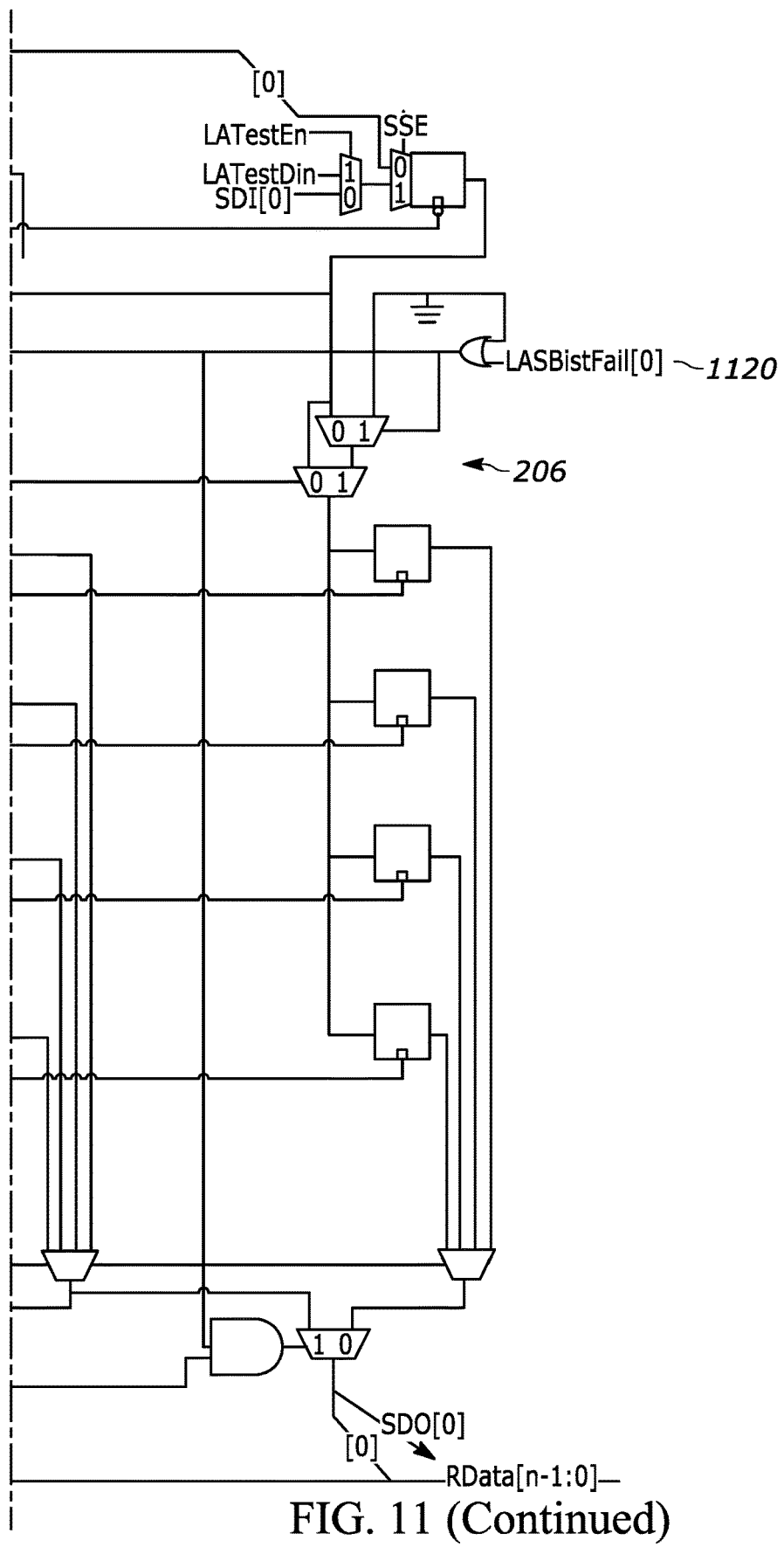

FIGS. 10A, 10B and FIG. 11 illustrate an example of column repair as opposed to row repair. This implementation identifies a failing column as it is tested and sets its LAS-BISTFailbit shown as data 1120. The latch array test and repair controller 1010 issues latch repair data 1011, such as ApplyLatchRpr to the spare latch array elements 208 and the latch array repair logic 206 to use the repair column and deselect the column that includes at least one defective latch. For example, the data 1120 (FIG. 11) is used as the repair logic to select the repair latches in the form of column shown as repair latches 1100A-1100D. As shown in FIG. 10B, the latch array test and repair controller 1010 generates the latch repair data 1011, in this example, ApplyLatchRpr. The test data comparator logic 1020 issues a column fail indication for each column that fails and the control logic 1000 issues control data such as the LABIST fail bits. The latch array test and repair controller 1010 issues the apply latch repair data 1011 to be equal to a logical "0" during a first pass of testing and to a logical "1" in a second pass of testing. The test operations for the built-in self-test are illustrated in FIG. 9 as previously described. As set forth herein, latch array built in self-test and repair logic can be used to repair one or more rows or columns in a latch array.

As set forth above and in FIGS. 2-9, example methods of operating a latch array having plurality of latches logically configured in rows and columns, include configuring each of a plurality of columns of the latch array as a serial test shift register; detecting one or more defective latches of the plurality of latches based on applied test data; and selecting the plurality of repair latches in response to detection of at least one detected defective latch and deselect the defective latch. The method in some implementations includes using a test scan pointer to sequentially select each row (or column) in the latch array during a test mode to load on-chip test data into the serial test shift registers. For row repair the method in some implementations includes repairing one or more detected defective latches by selecting a row of repair latches and deselecting a row of latches that includes the detected defective latch. When column repair is employed a method includes repairing one or more detected defective latches by selecting a column of repair latches and deselecting a column of latches that includes the detected defective latch. In certain implementations, the method includes performing in-field latch array testing and repair of one or more defective latch arrays when repair latches are available for repair. In some implementations, the control logic includes a register(s) which indicates which repair resource(s) are currently in use, and thus which resource(s) are still available for in-field repair.

One or more technical benefits of the disclosed repairable latch array is that larger latch arrays can be utilized without requiring MBIST circuits and control as described above, increases yield during manufacture can occur and in-field repairability of latch arrays is provided when applied post manufacture. This can improve die reliability such as those used in data centers by avoiding silent data corruption (SDC). Other advantages will be recognized by those of ordinary skill in the art. For example, with the serial shift register operation shown and repair logic, there are fewer sequential elements required as compared, for example, to an MBIST logic and dies do not need to be discarded due to latch array failure.

When in field latch array testing and repair is performed, systems, for example, within data centers or in other applications need not have chips removed and instead when latches are detected to be defective, through a bit failure through, for example, normal wear out, the test and repair operation is activated, for example, by the processing circuitry or other logic to reenable the latch array. For example, during each power on, an in field repair operation can be done to select the repair latch operation. Other benefits in other applications, for example, will be in automobiles and other applications to avoid the replacement of component parts and instead allow latch array repair to occur.

Although features and elements are described above in particular combinations, each feature or element can be used alone without the other features and elements or in various combinations with or without other features and elements. The apparatus described herein in some implementations use software or firmware incorporated in a non-transitory computer-readable storage medium for execution by a general-purpose computer or a processor. Examples of computer-readable storage mediums include a read only memory (ROM), a random-access memory (RAM), a register, cache memory, semiconductor memory devices, magnetic media such as internal hard disks and removable disks, magneto-optical media, and optical media such as CD-ROM disks, and digital versatile disks (DVDs).

In the preceding detailed description of the various embodiments, reference has been made to the accompanying drawings which form a part thereof, and in which is shown by way of illustration specific preferred embodiments in which the invention may be practiced. These embodiments are described in sufficient detail to enable those skilled in the art to practice the invention, and it is to be understood that other embodiments may be utilized, and that logical, mechanical and electrical changes may be made without departing from the scope of the invention. To avoid detail not necessary to enable those skilled in the art to practice the invention, the description may omit certain information known to those skilled in the art. Furthermore, many other varied embodiments that incorporate the teachings of the disclosure may be easily constructed by those skilled in the art. Accordingly, the present invention is not intended to be limited to the specific form set forth herein, but on the contrary, it is intended to cover such alternatives, modifications, and equivalents, as can be reasonably included within the scope of the invention. The preceding detailed description is, therefore, not to be taken in a limiting sense, and the scope of the present invention is defined only by the appended claims. The above detailed description of the embodiments and the examples described therein have been presented for the purposes of illustration and description only and not by limitation. For example, the operations described are done in any suitable order or manner. It is therefore contemplated that the present invention covers any and all modifications, variations or equivalents that fall within the scope of the basic underlying principles disclosed above and claimed herein.

The above detailed description and the examples described therein have been presented for the purposes of illustration and description only and not for limitation.

What is claimed is:

1. An integrated circuit comprising:
a latch array comprising:
a plurality of latches logically configured in rows and columns;
a plurality of repair latches operatively coupled to the plurality of latches; and
latch array built in self-test and repair logic operatively coupled to the plurality of latches and configured to:
identify defective latches of the plurality of latches in the latch array;
repair the defective latches using redundant latches; and
retest the latch array using redundant latches.

2. The integrated circuit of claim 1 wherein the latch array built in self-test and repair logic is configured to:
perform in-field latch array testing of the plurality of latches; and
perform in-field repair of one or more defective latch arrays, in response to repair latches being indicated to be available for in-field repair.

3. The integrated circuit of claim 1 wherein the latch array built in self-test and repair logic comprises a test scan pointer operative to sequentially select each row in the latch array during a test mode to load on-chip test data into at least one serial test shift register.

4. The integrated circuit of claim 1 wherein the latch array built in self-test and repair logic is operative to repair one or more defective latches by selecting a row of repair latches and deselecting a row of latches that includes at least one defective latch.

5. The integrated circuit of claim 1 wherein the latch array built in self-test and repair logic is operative to repair one or more defective latches by selecting a column of repair latches and deselecting a column of latches that includes at least one defective latch.

6. The integrated circuit of claim 1 comprising control logic operative to automatically retest the latch array using selected repair latches.

7. The integrated circuit of claim 2 wherein the latch array built in self-test and repair logic is operative to load on-chip test data into configured serial test shift registers on a row by row basis.

8. An integrated circuit comprising:
processing circuitry;
a latch array, operatively coupled to the processing circuitry, comprising:
a plurality of latches logically configured in rows and columns;
a plurality of repair latches operatively coupled to the plurality of latches; and
latch array built in self-test and repair logic operatively coupled to the plurality of latches and configured to:
identify defective latches of the plurality of latches in the latch array;
repair the defective latches using redundant latches; and
retest the latch array using redundant latches.

9. The integrated circuit of claim 8 wherein the latch array built in self-test and repair logic is configured to:
perform in-field latch array testing of the plurality of latches; and
perform in-field repair of one or more defective latch arrays, in response to repair latches being indicated to be available for in-field repair.

10. The integrated circuit of claim 8 wherein the latch array built in self-test and repair logic comprises a test scan pointer operative to sequentially select each row in the latch array during a test mode to load on-chip test data into at least one serial test shift register.

11. The integrated circuit of claim 8 wherein the latch array built in self-test and repair logic is operative to repair one or more defective latches by selecting a row of repair latches and deselecting a row of latches that includes at least one defective latch.

12. The integrated circuit of claim 8 wherein the latch array built in self-test and repair logic is operative to repair one or more defective latches by selecting a column of repair latches and deselecting a column of latches that includes at least one defective latch.

13. The integrated circuit of claim 8 comprising control logic operative to automatically retest the latch array using selected repair latches.

14. The integrated circuit of claim 9 wherein the latch array built in self-test and repair logic is operative to load on-chip test data into configured serial test shift registers on a row by row basis.

15. A method of operating a latch array having a plurality of latches logically configured in rows and columns, the method comprising:
- identifying defective latches of the plurality of latches in the latch array;
- repairing the defective latches using redundant latches; and
- retesting the latch array using redundant latches.

16. The method of claim 15 comprising,
- performing in-field latch array testing of the plurality of latches; and
- performing in-field repair of one or more defective latch arrays, in response to repair latches being indicated to be available for in-field repair.

17. The method of claim 15 comprising using a test scan pointer to sequentially select each row in the latch array during a test mode to load on-chip test data into at least one serial test shift register.

18. The method of claim 15 comprising repairing one or more defective latches by selecting a row of repair latches and deselecting a row of latches that includes at least one defective latch.

19. The method of claim 15 comprising repairing one or more detected defective latches by selecting a column of repair latches and deselecting a column of latches that includes at least one defective latch.

20. The method of claim 16 further comprising:
- wherein identifying defective latches comprises configuring a plurality of latches that are in a column as at least one serial test shift register and detecting at least one defective latch of the plurality of latches based on applied test data; and
- wherein repairing the defective latches comprises selecting at least one repair latch in response to detection of at least one defective latch and deselecting the at least one defective latch.

* * * * *